(12) United States Patent
Yeong et al.

(10) Patent No.: US 12,165,925 B2
(45) Date of Patent: Dec. 10, 2024

(54) FIN FIELD EFFECT TRANSISTOR HAVING AIRGAP AND METHOD FOR MANUFACTURING THE SAME

(71) Applicant: Taiwan Semiconductor Manufacturing Company, Ltd., Hsinchu (TW)

(72) Inventors: Sai-Hooi Yeong, Hsinchu County (TW); Kai-Hsuan Lee, Hsinchu (TW); Yu-Ming Lin, Hsinchu (TW); Chi-On Chui, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/354,670

(22) Filed: Jul. 19, 2023

(65) Prior Publication Data

US 2023/0369120 A1    Nov. 16, 2023

Related U.S. Application Data

(63) Continuation of application No. 18/080,677, filed on Dec. 13, 2022, now Pat. No. 11,776,855, which is a
(Continued)

(51) Int. Cl.
| | |
|---|---|
| H01L 21/8234 | (2006.01) |
| H01L 21/308 | (2006.01) |
| H01L 21/762 | (2006.01) |
| H01L 21/764 | (2006.01) |
| H01L 21/768 | (2006.01) |

(Continued)

(52) U.S. Cl.
CPC .. *H01L 21/823431* (2013.01); *H01L 21/3086* (2013.01); *H01L 21/76224* (2013.01); *H01L 21/764* (2013.01); *H01L 21/76802* (2013.01); *H01L 21/823475* (2013.01); *H01L 21/823481* (2013.01); *H01L 27/0886* (2013.01); *H01L 29/0649* (2013.01); *H01L 29/66545* (2013.01); *H01L 29/66795* (2013.01); *H01L 29/785* (2013.01)

(58) Field of Classification Search
CPC ....... H01L 21/823431; H01L 21/76224; H01L 21/76802
See application file for complete search history.

(56) References Cited

U.S. PATENT DOCUMENTS

| 8,772,109 B2 | 7/2014 | Colinge |
| 8,785,285 B2 | 7/2014 | Tsai et al. |

(Continued)

*Primary Examiner* — Errol V Fernandes
(74) *Attorney, Agent, or Firm* — JCIPRNET

(57) ABSTRACT

A method of manufacturing a FinFET includes at last the following steps. A semiconductor substrate is patterned to form trenches in the semiconductor substrate and semiconductor fins located between two adjacent trenches of the trenches. Gate stacks is formed over portions of the semiconductor fins. Strained material portions are formed over the semiconductor fins revealed by the gate stacks. First metal contacts are formed over the gate stacks, the first metal contacts electrically connecting the strained material portions. Air gaps are formed in the FinFET at positions between two adjacent gate stacks and between two adjacent strained materials.

20 Claims, 28 Drawing Sheets

Related U.S. Application Data continuation of application No. 17/389,299, filed on Jul. 29, 2021, now Pat. No. 11,557,517, which is a continuation of application No. 16/286,558, filed on Feb. 26, 2019, now Pat. No. 11,081,395.

(60) Provisional application No. 62/712,230, filed on Jul. 31, 2018.

(51) Int. Cl.
*H01L 27/088* (2006.01)
*H01L 29/06* (2006.01)
*H01L 29/66* (2006.01)
*H01L 29/78* (2006.01)

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2015/0035023 A1* | 2/2015 | Kim .................. H01L 29/66795 257/288 |
| 2017/0076973 A1* | 3/2017 | Lee .................. H01L 29/66795 |

* cited by examiner

FIN FIELD EFFECT TRANSISTOR HAVING AIRGAP AND METHOD FOR MANUFACTURING THE SAME

CROSS-REFERENCE TO RELATED APPLICATION

This application is a continuation application of and claims the priority benefits of a prior U.S. application Ser. No. 18/080,677, filed on Dec. 13, 2022 and now allowed. The prior U.S. application Ser. No. 18/080,677 is a continuation application of and claims the priority benefits of a prior U.S. application Ser. No. 17/389,299, filed on Jul. 29, 2021. The prior U.S. application Ser. No. 17/389,299 is a continuation application of and claims the priority benefit of a prior application Ser. No. 16/286,558, filed on Feb. 26, 2019, which claims the priority benefit of U.S. provisional application Ser. No. 62/712,230, filed on Jul. 31, 2018. The entirety of each of the above-mentioned patent applications is hereby incorporated by reference herein and made a part of this specification.

BACKGROUND

As the semiconductor devices keeps scaling down in size, three-dimensional multi-gate structures, such as the fin-type field effect transistor (FinFET), have been developed to replace planar Complementary Metal Oxide Semiconductor (CMOS) devices. A structural feature of the FinFET is the silicon-based fin that extends upright from the surface of the semiconductor substrate, and the gate wrapping around the conducting channel that is formed by the fin further provides a better electrical control over the channel.

BRIEF DESCRIPTION OF THE DRAWiNGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
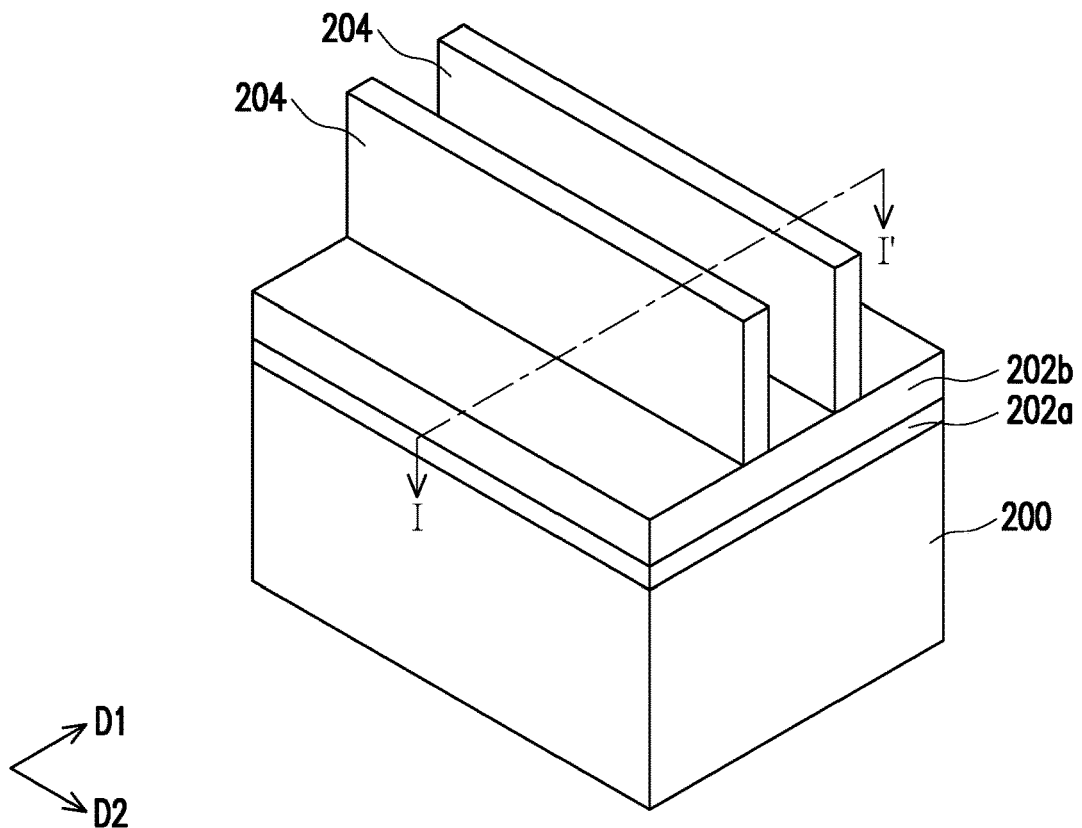
FIG. 1A to FIG. 1S are perspective views illustrating a manufacturing method of a FinFET in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The embodiments of the present disclosure describe the exemplary manufacturing process of one or more FinFETs and the FinFETs fabricated there-from, where the FinFETs may also referred to as a semiconductor device herein. The FinFET may be formed on bulk silicon substrates in certain embodiments of the present disclosure. Still, the FinFET may be formed on a silicon-on-insulator (SOI) substrate as alternatives. Also, in accordance with the embodiments, the silicon substrate may include other conductive layers or other semiconductor elements, such as transistors, diodes or the like. The embodiments are not limited in this context.

Figure 2A:
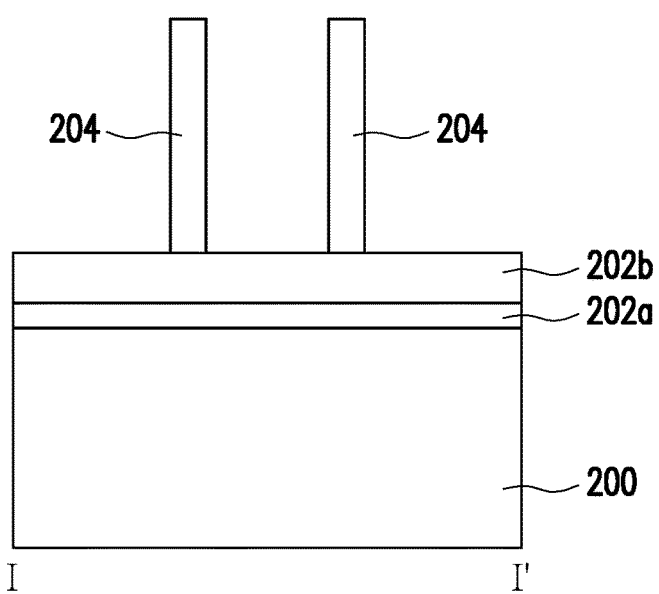
FIG. 2A to FIG. 2S are cross-sectional views of the FinFET depicted in FIG. 1A to FIG. 1S.
Figure 1B:
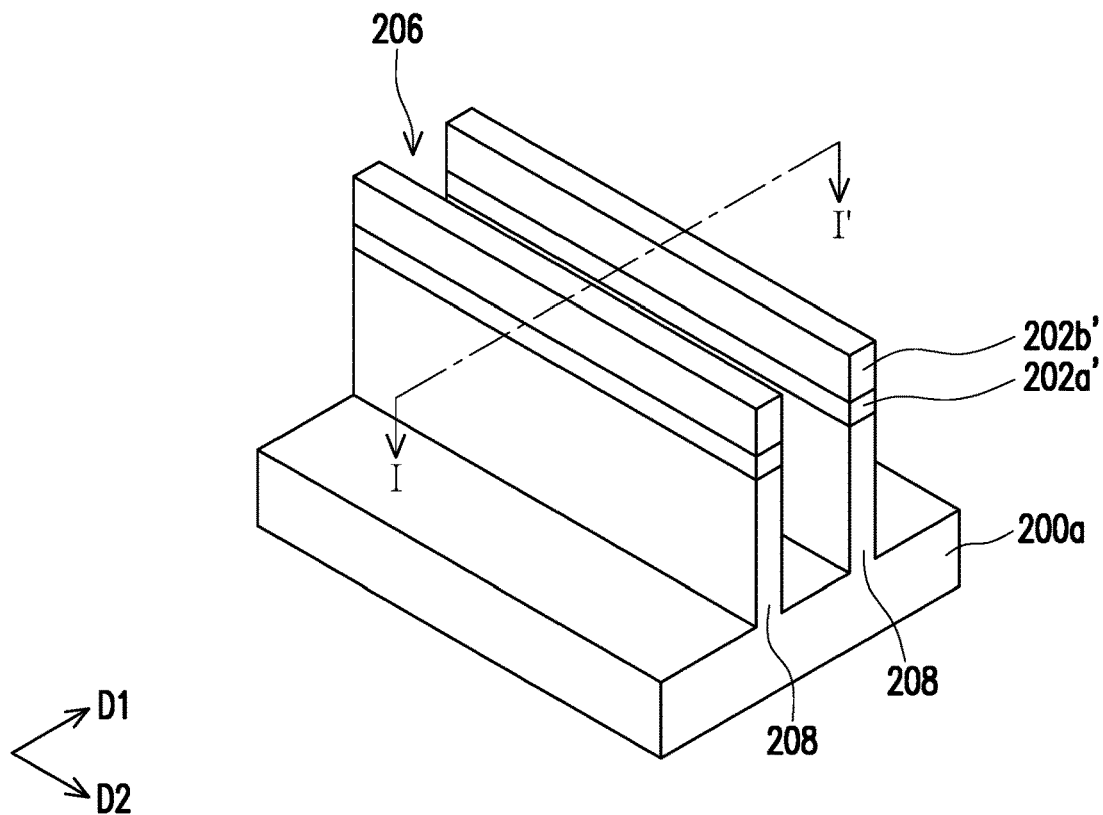
Figure 1C:
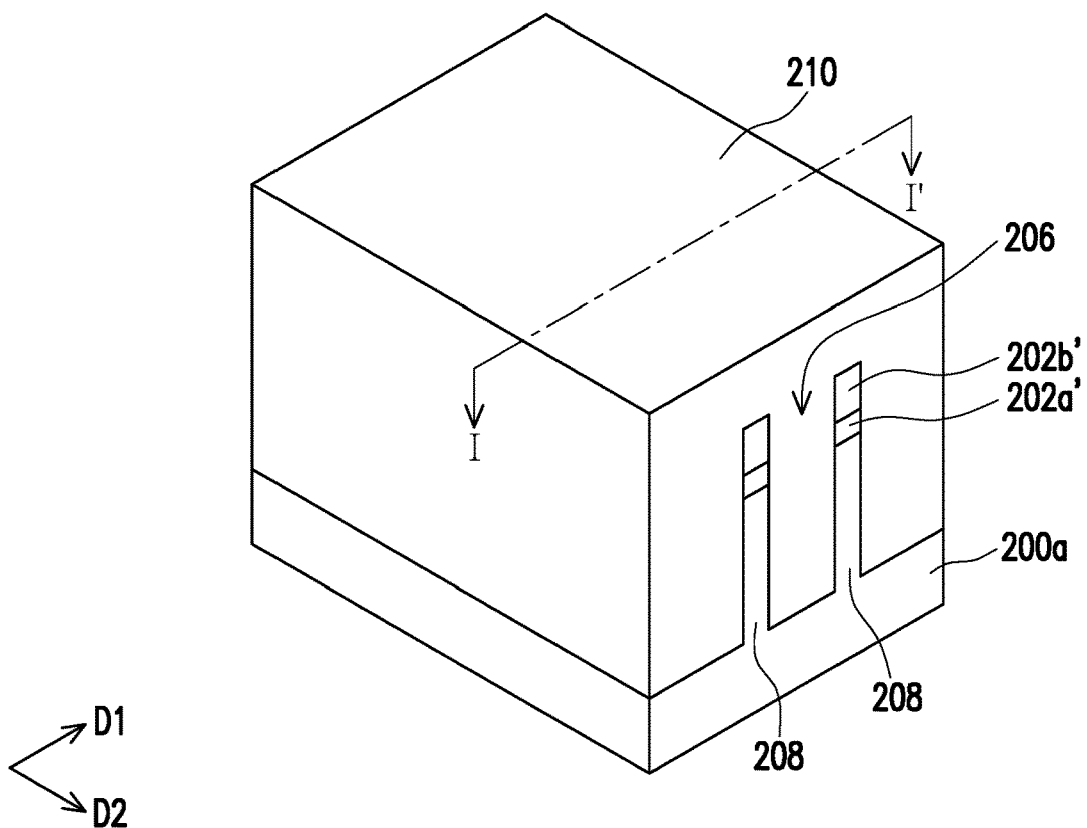
Figure 1D:
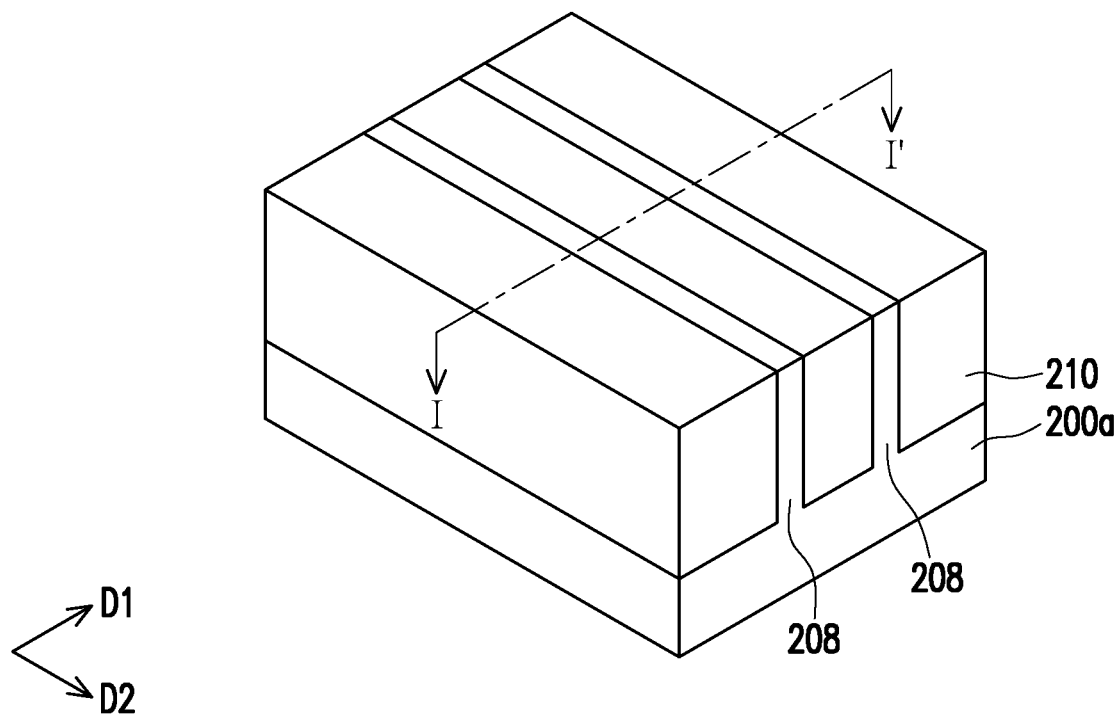
Figure 1E:
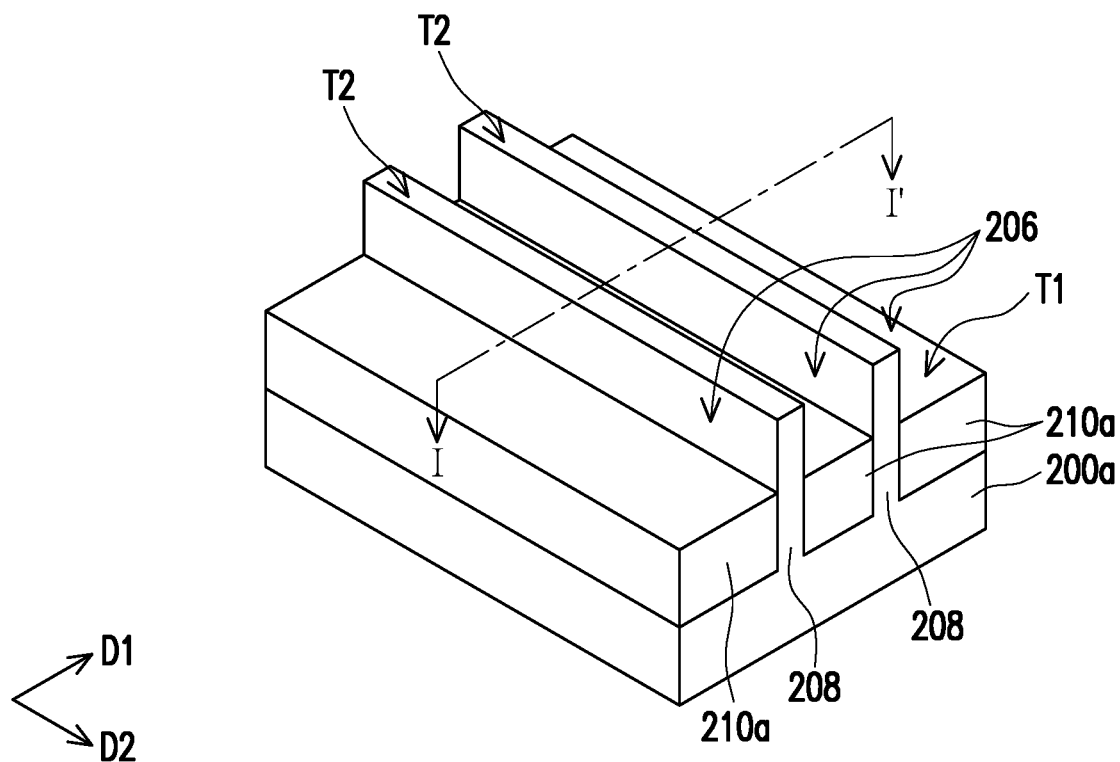
Figure 1F:
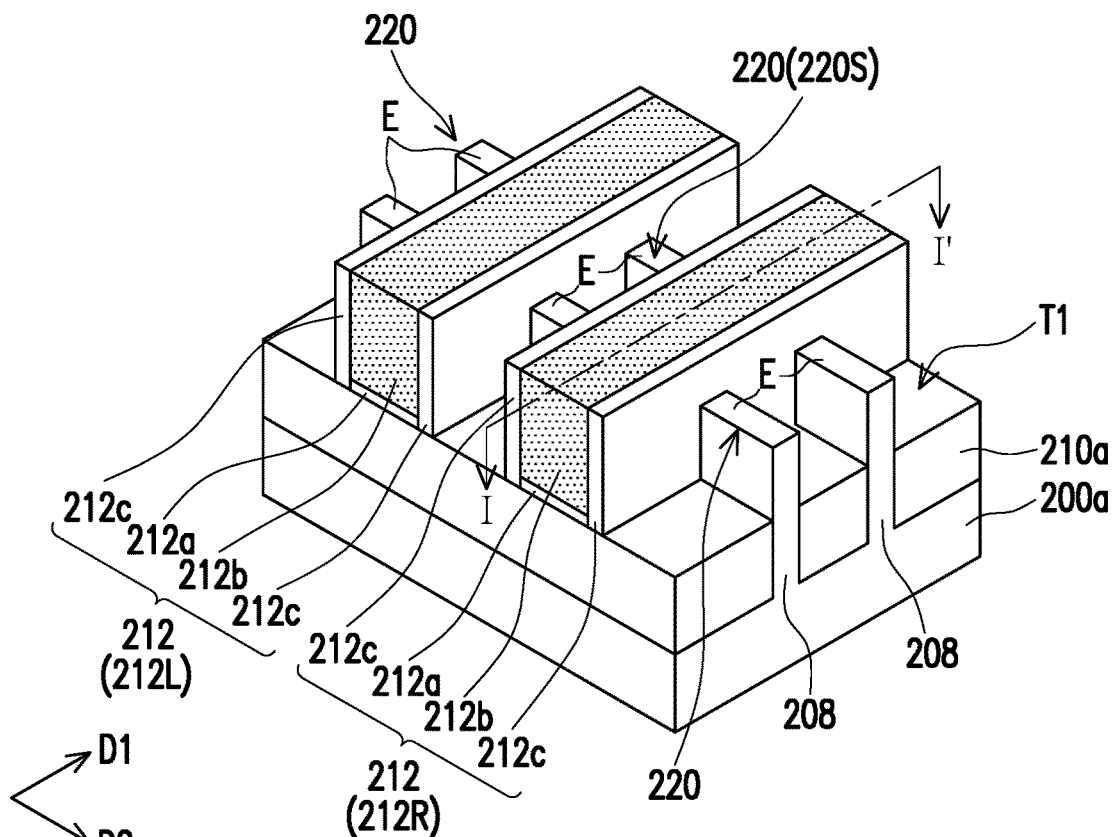
Figure 1G:
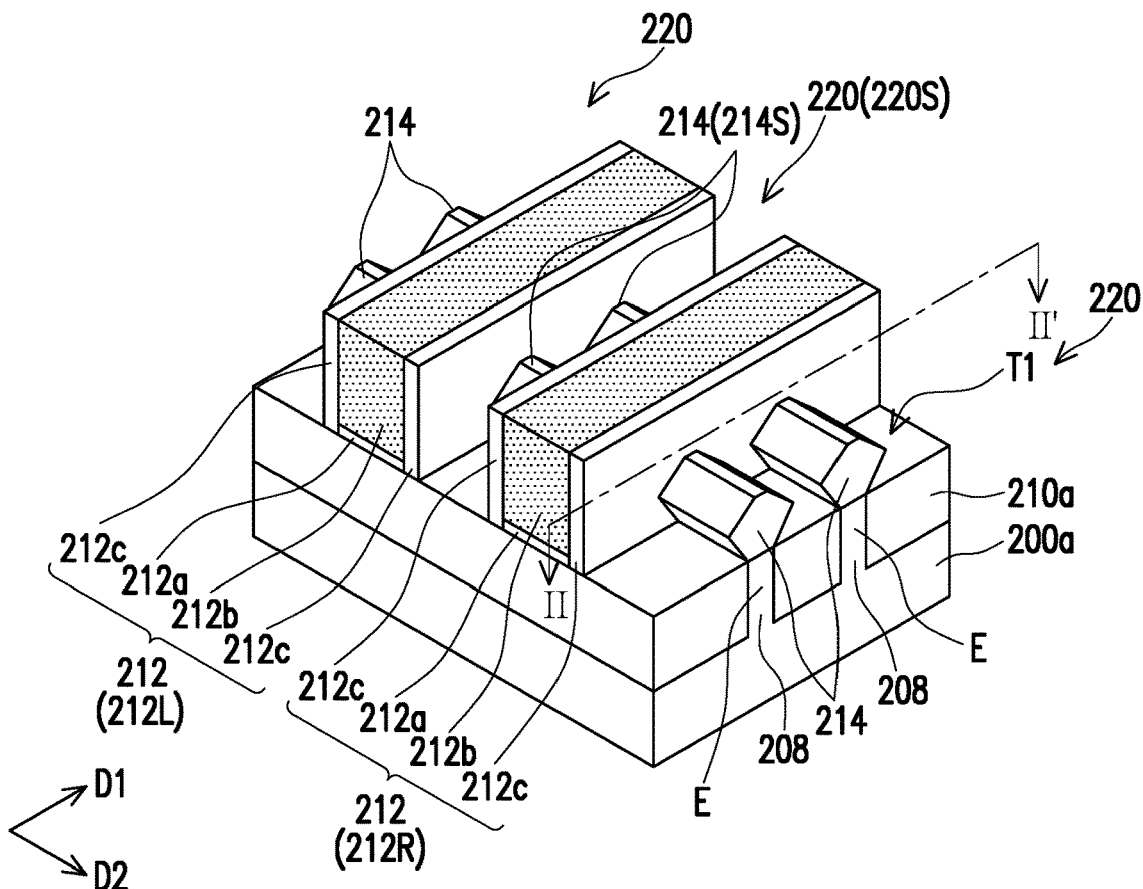
Figure 1H:
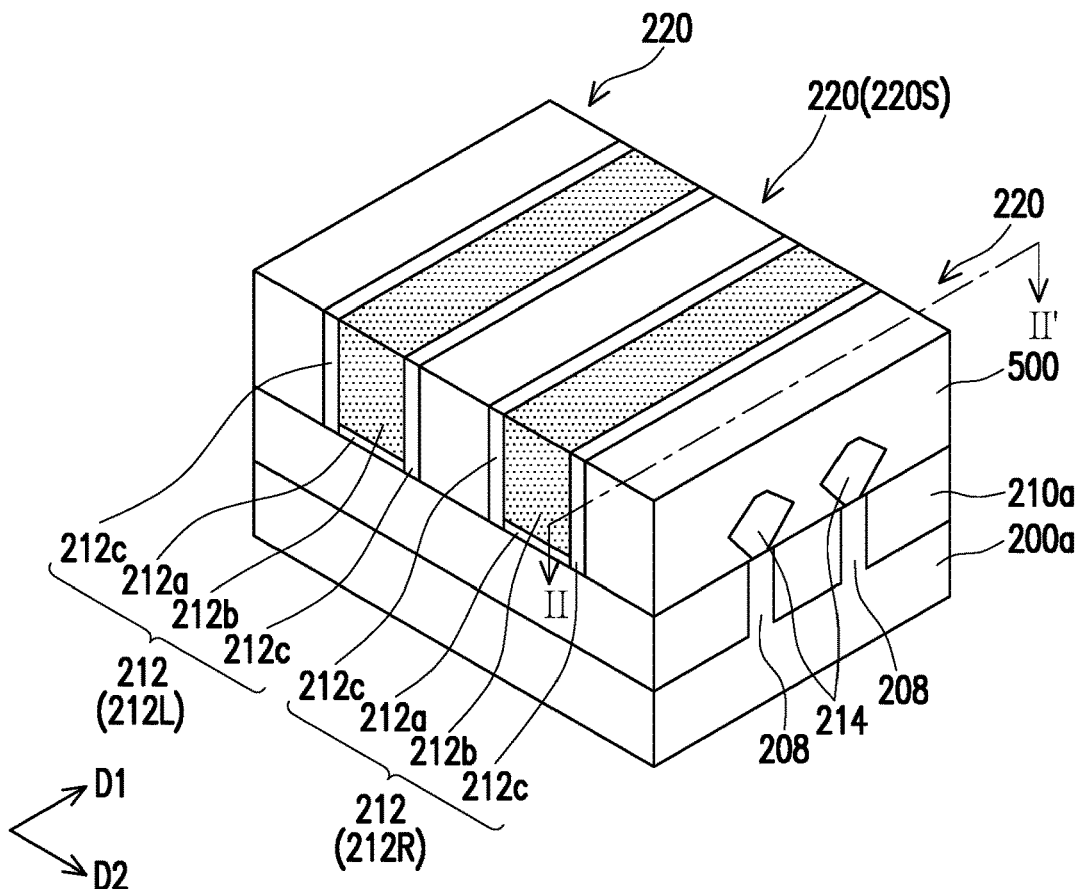
Figure 1I:
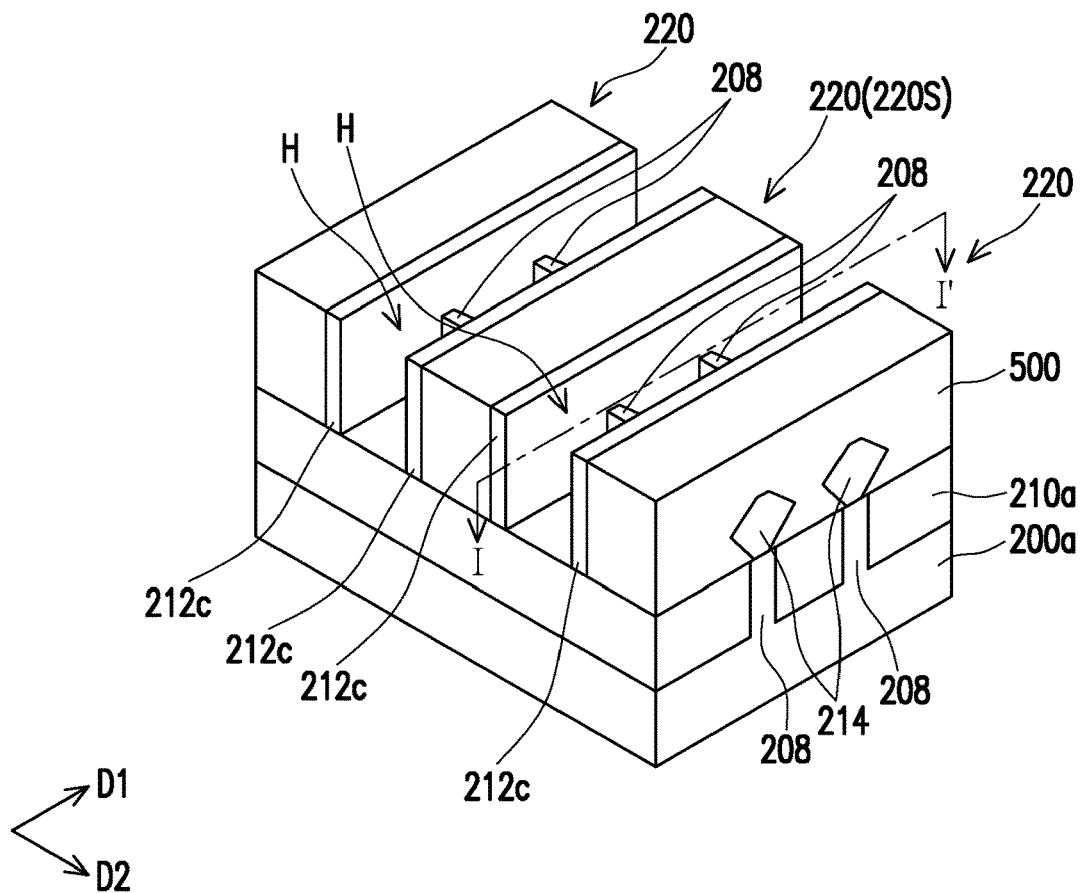
Figure 1J:
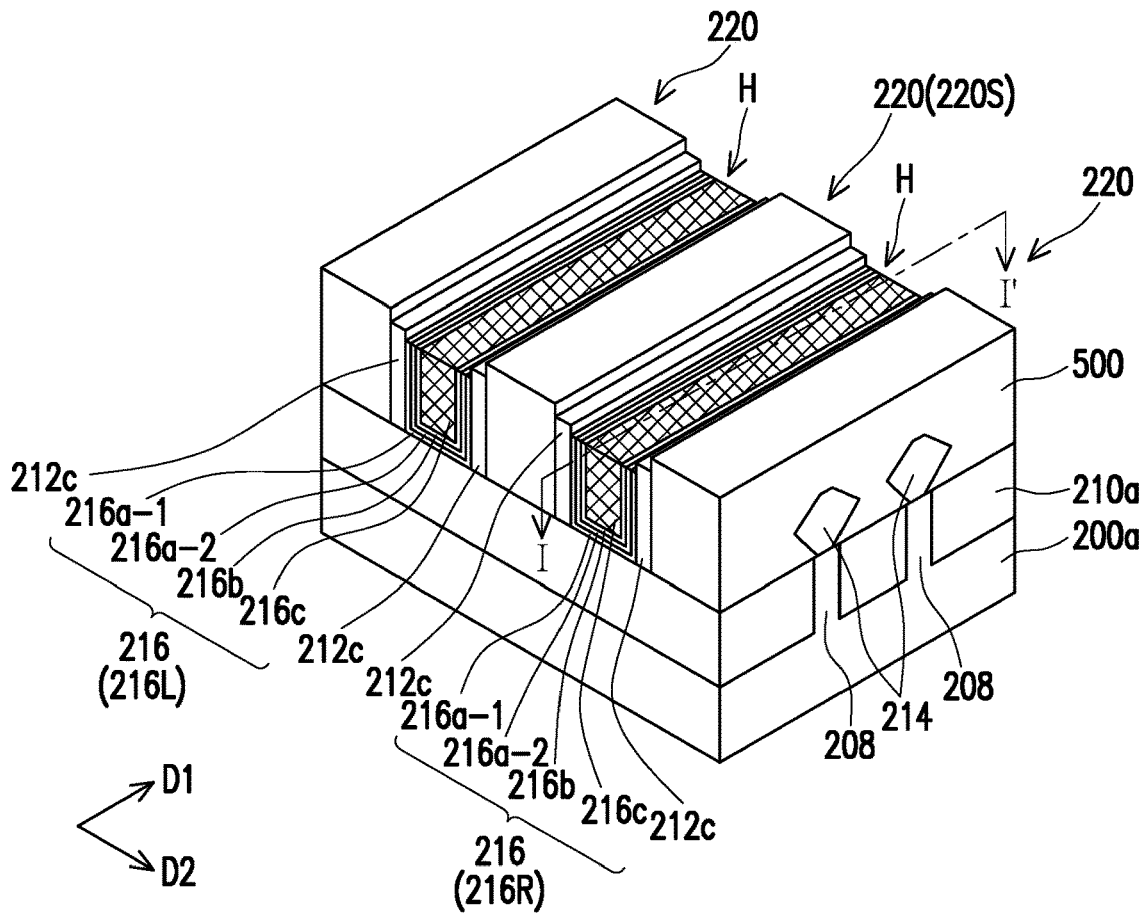
Figure 1K:
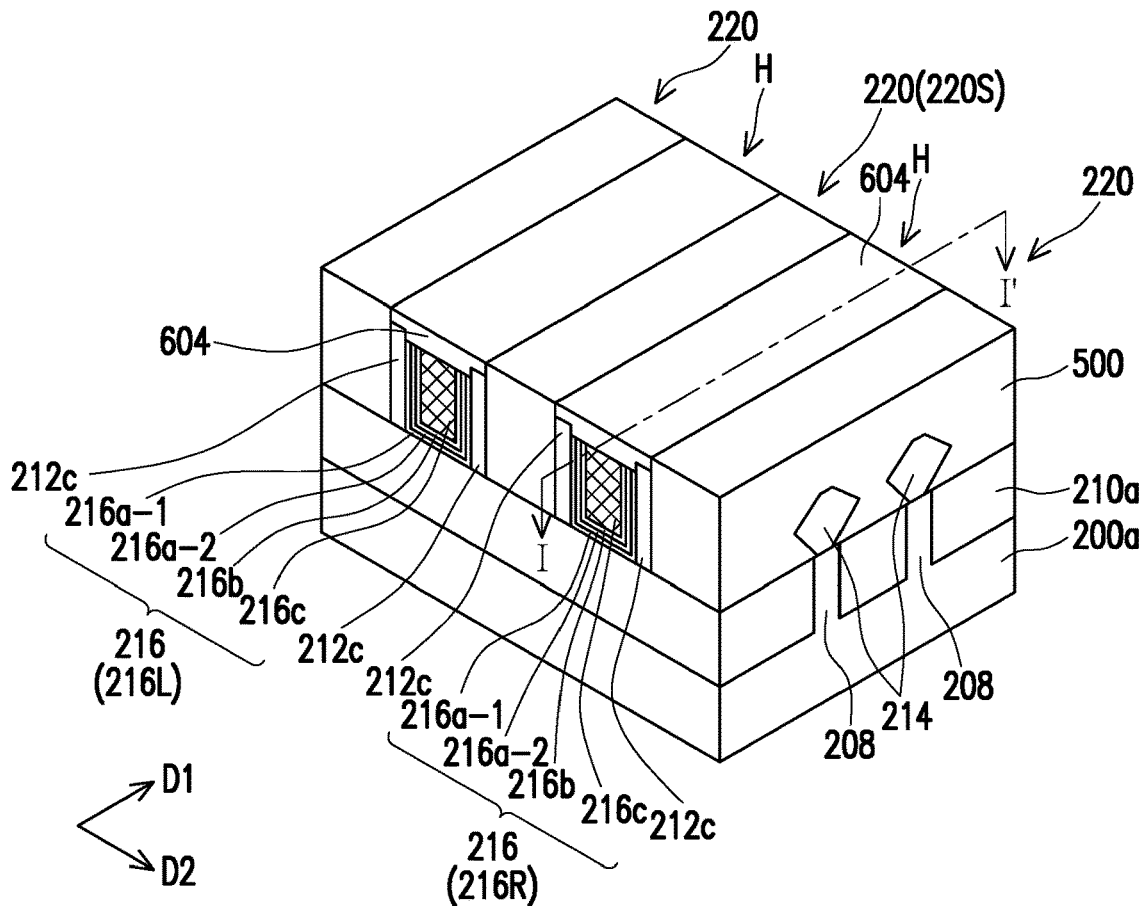
Figure 1L:
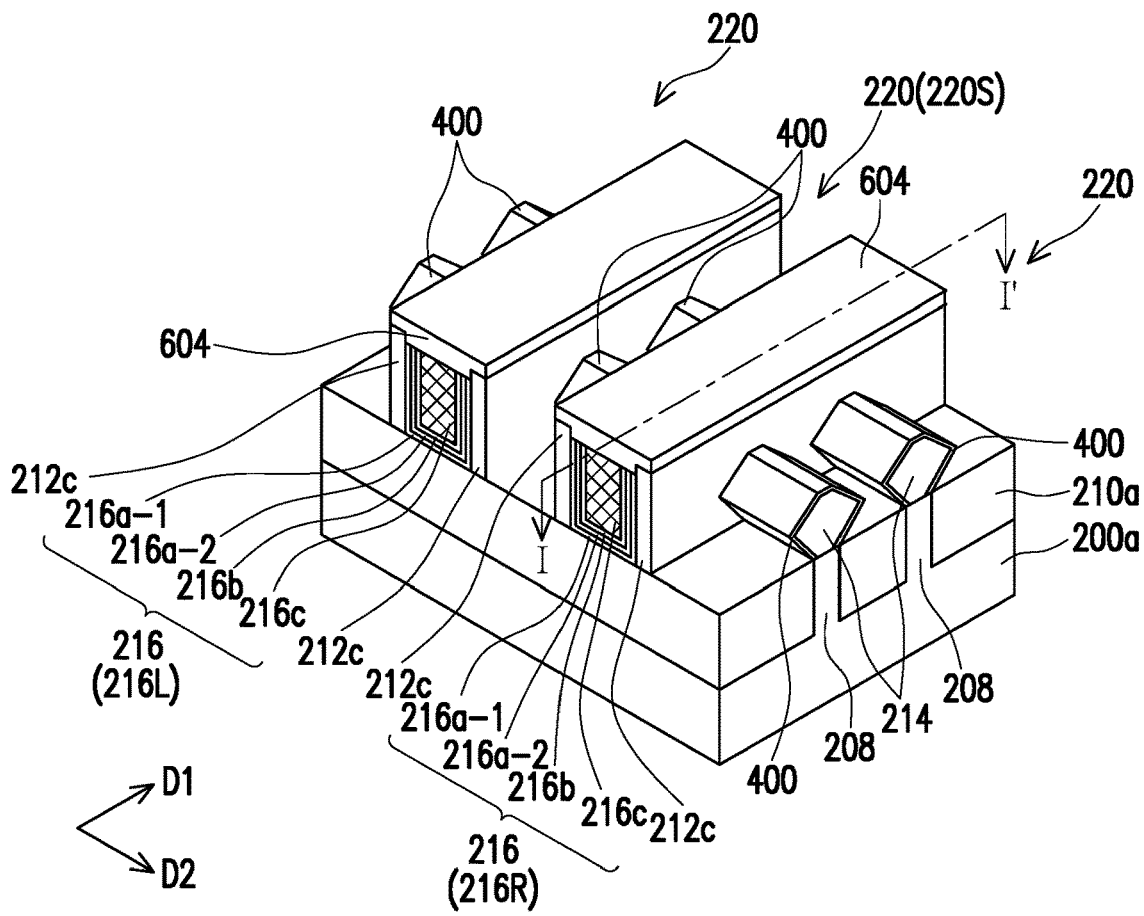
Figure 1M:
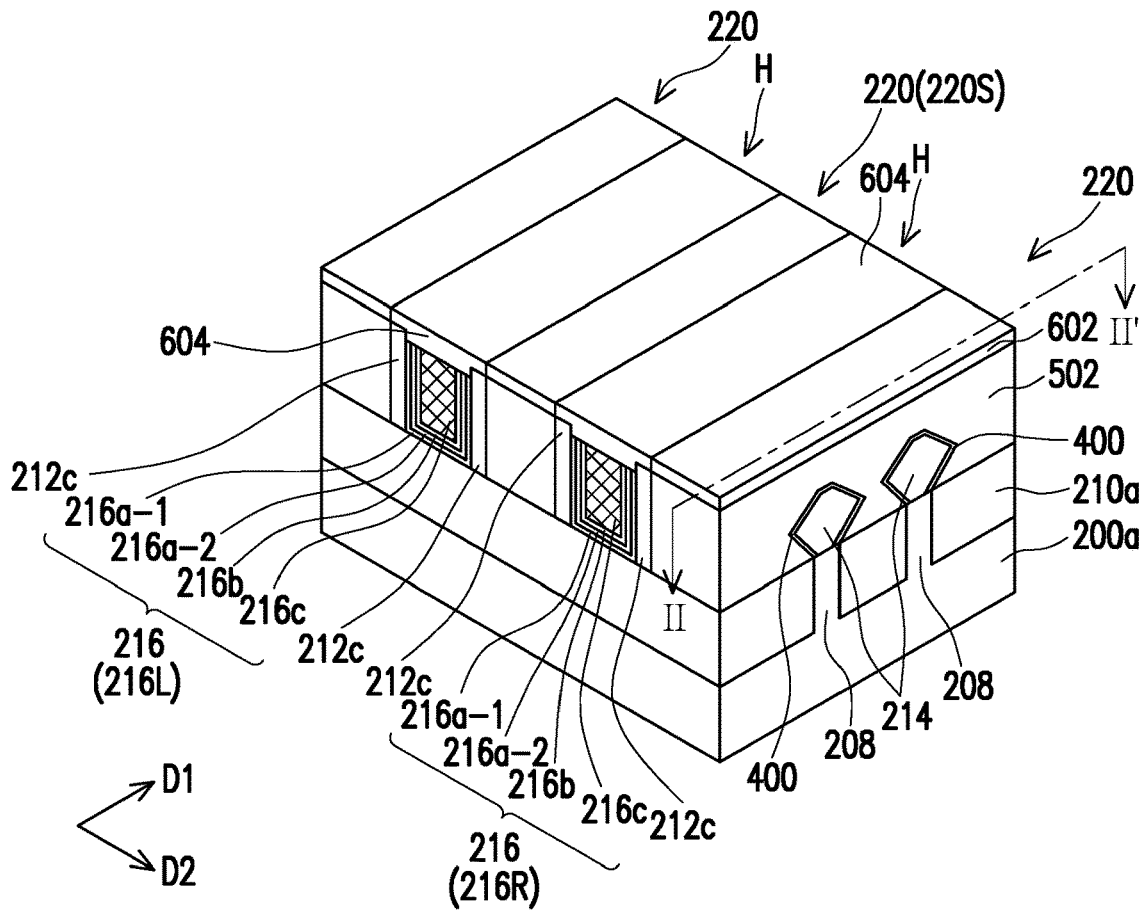
Figure 1N:
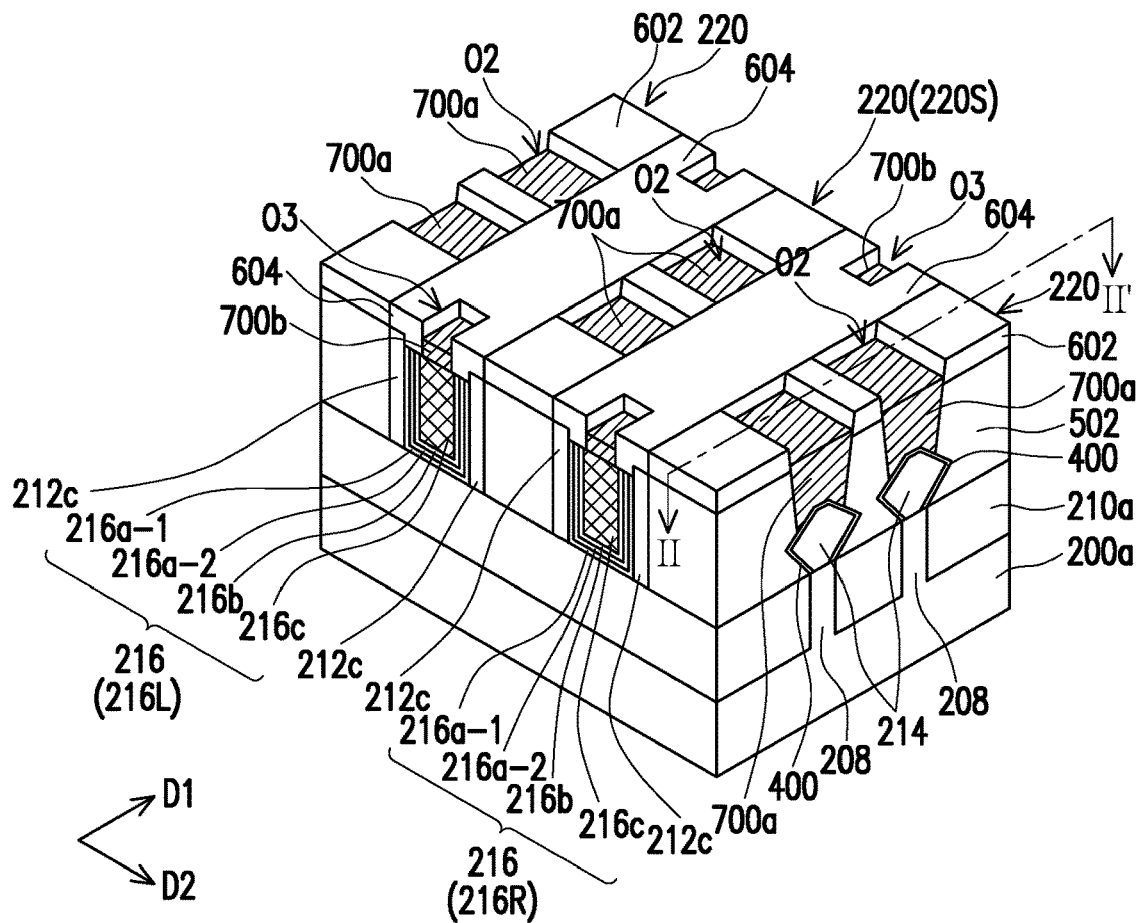
Figure 1P:
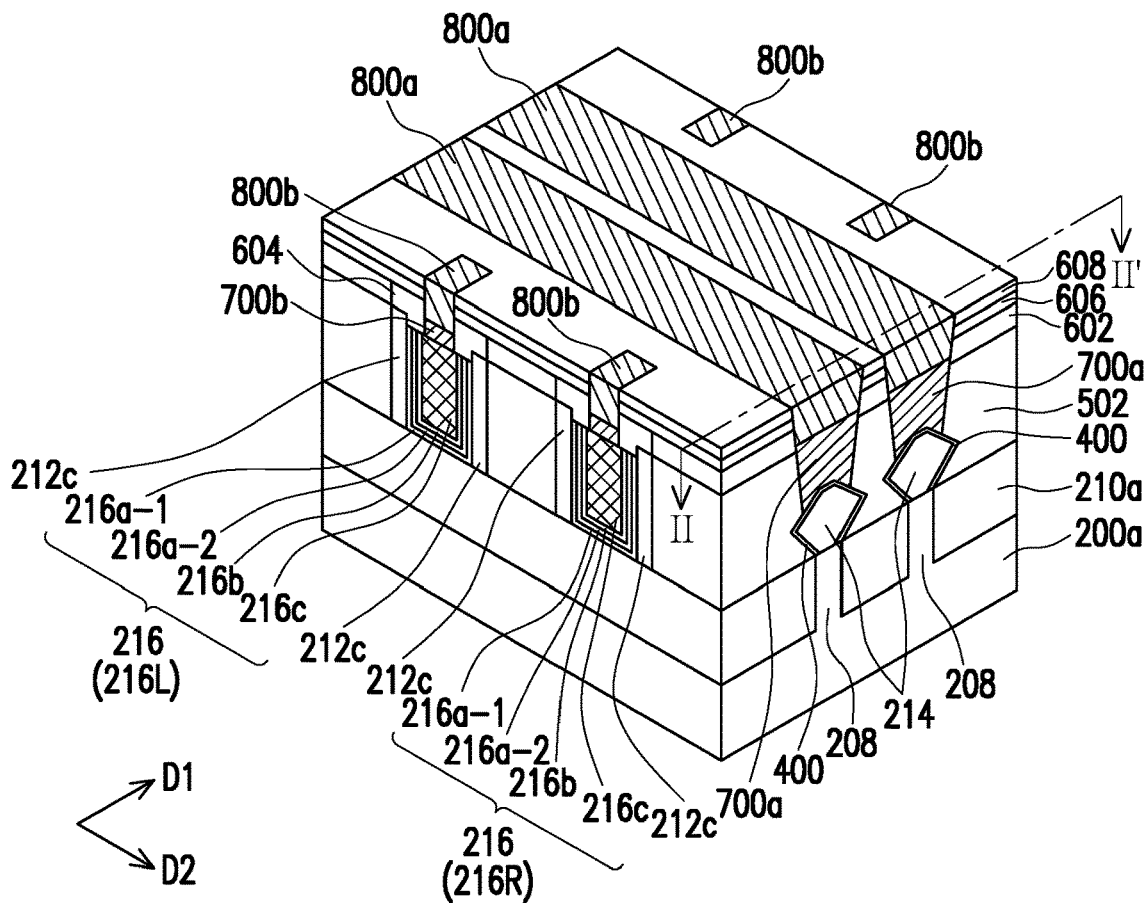
Figure 1Q:
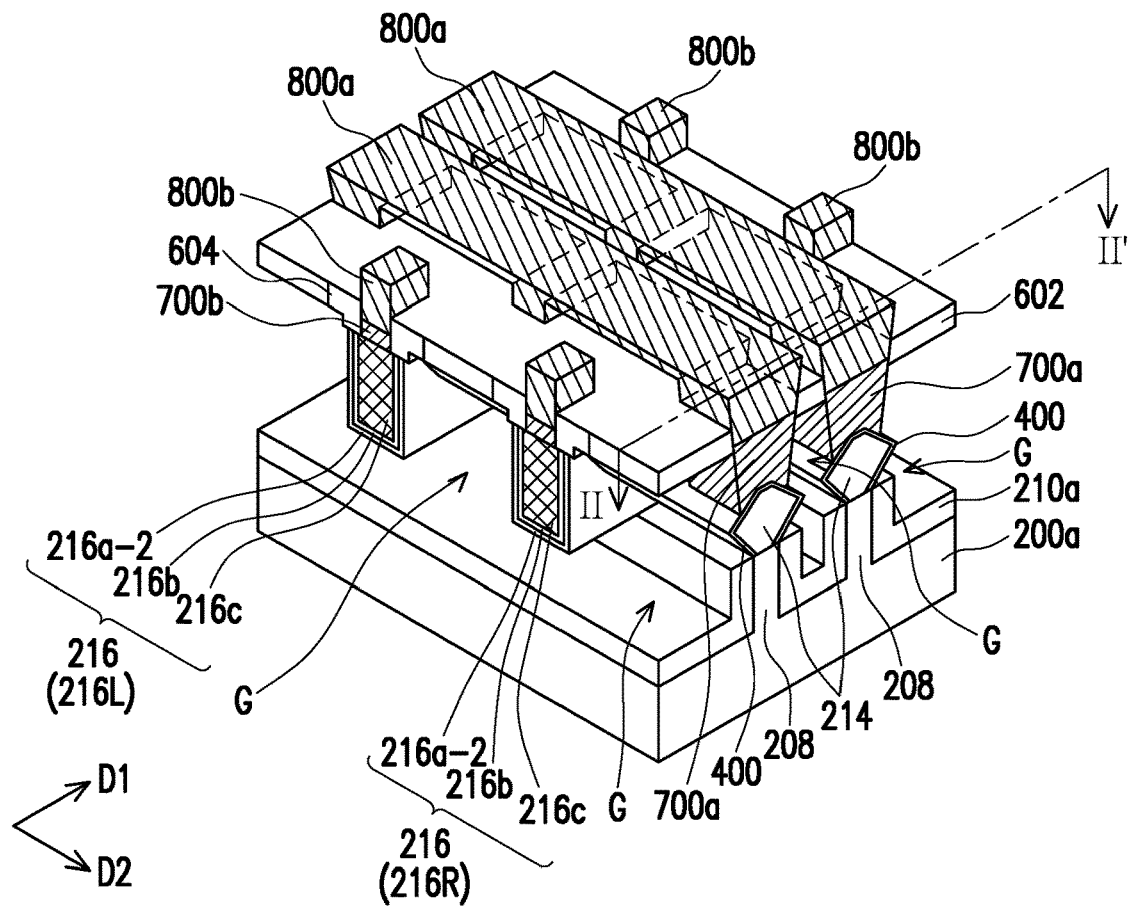
Figure 1R:
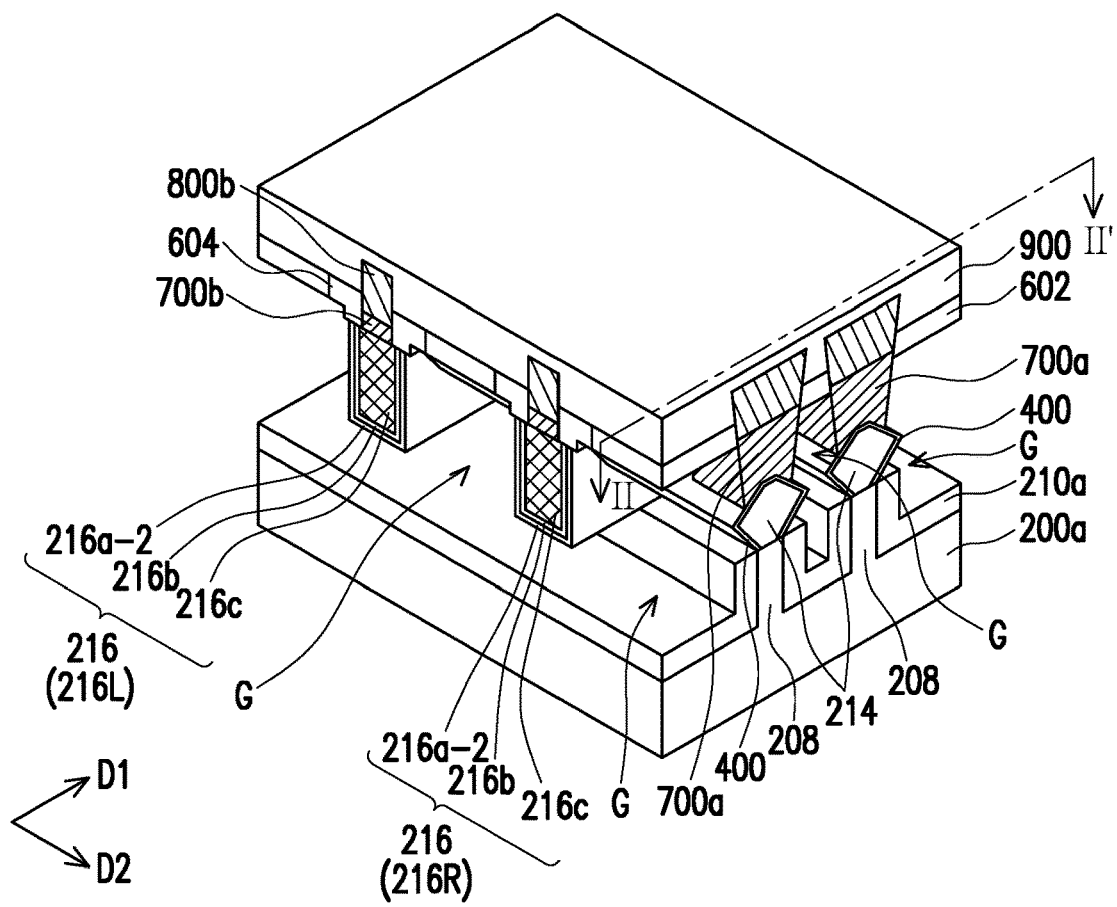
Figure 1S:
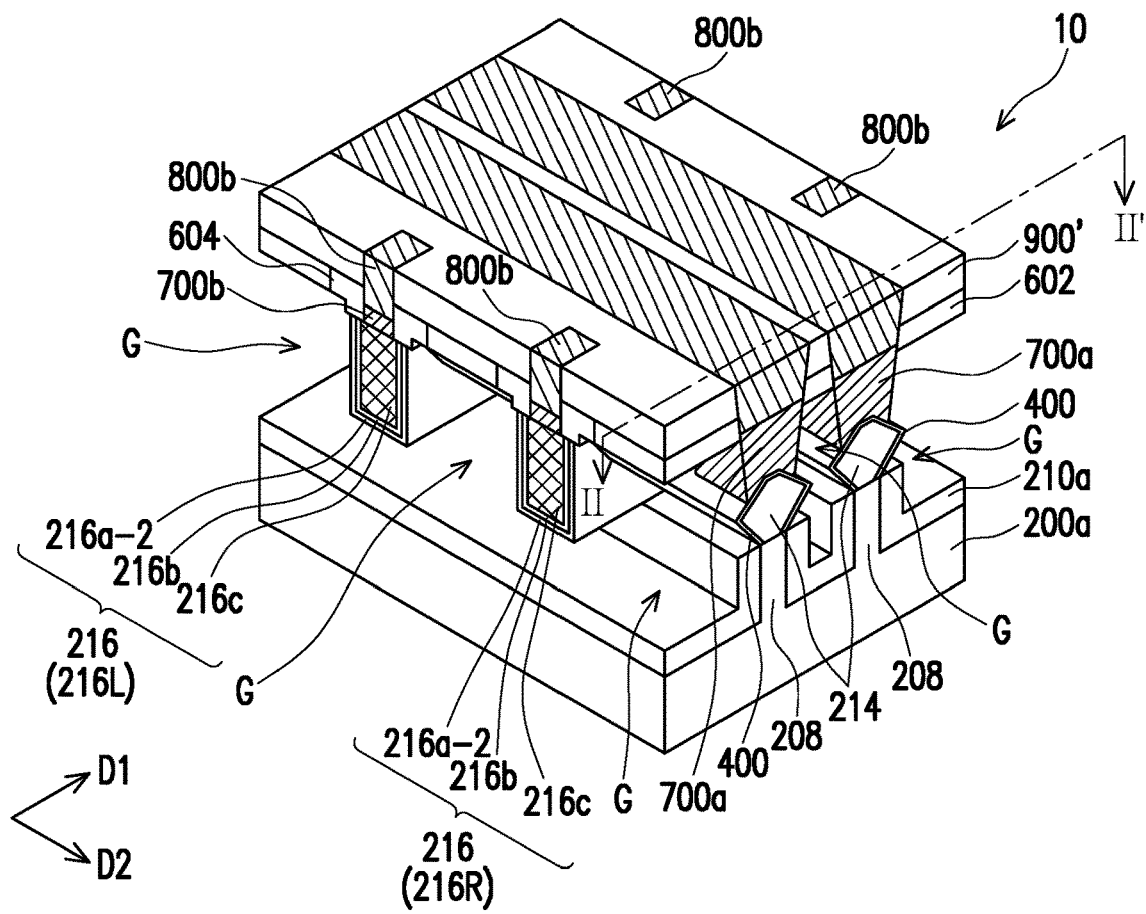
Figure 2S:
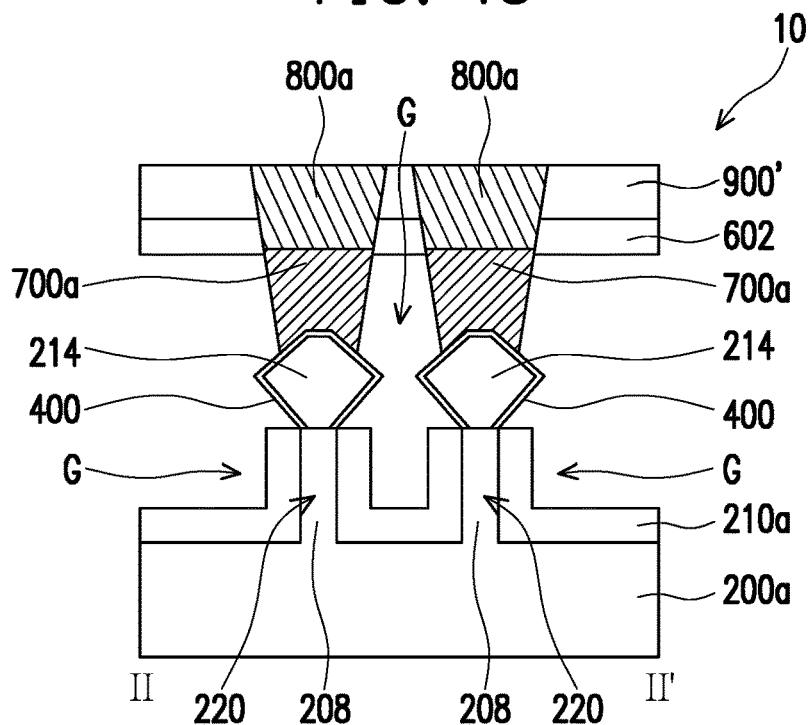
Figure 3:
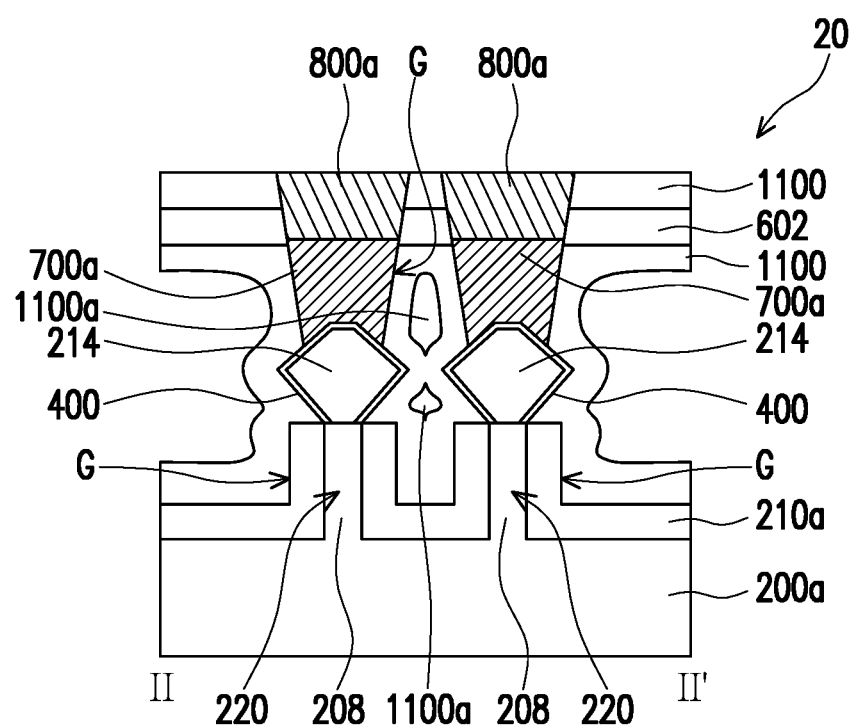
FIG. 3 is a cross-sectional view illustrating a FinFET in accordance with some embodiments of the disclosure.

FIG. 1A to FIG. 1S are perspective views illustrating a manufacturing method of a FinFET in accordance with some embodiments of the disclosure. FIG. 2A to FIG. 2S are cross-sectional views of the FinFET depicted in FIG. 1A to FIG. 1S, respectively. FIG. 3 is a cross-sectional view illustrating a FinFET in accordance with some embodiments of the disclosure. Referring to FIG. 1A and FIG. 2A, in some embodiments, a semiconductor substrate 200 is provided. In some embodiments, the semiconductor substrate 200 includes a crystalline silicon substrate (e.g., wafer). The semiconductor substrate 200 may include various doped regions depending on design requirements (e.g., p-type semiconductor substrate or n-type semiconductor substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively configured for a p-type FinFET. In some alternative embodiments, the semiconductor substrate 200 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide.

In some embodiments, a pad layer 202a and a mask layer 202b are sequentially formed on the semiconductor substrate 200. The pad layer 202a may be a silicon oxide thin film formed by, for example, a thermal oxidation process. The pad layer 202a may act as an adhesion layer between the semiconductor substrate 200 and the mask layer 202b. The pad layer 202a may also act as an etch stop layer for etching the mask layer 202b. In some embodiments, the mask layer 202b is a silicon nitride layer formed by, for example, low-pressure chemical vapor deposition (LPCVD) or plasma enhanced chemical vapor deposition (PECVD). The mask layer 202b is used as a hard mask during subsequent photolithography processes. A patterned photoresist layer 204 having a predetermined pattern is formed on the mask layer 202b.

Figure 2B:
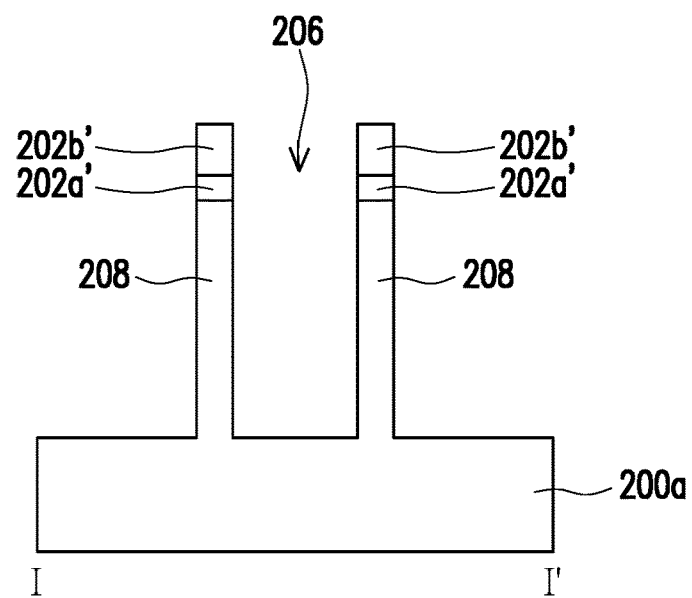

Referring to FIG. 1B and FIG. 2B, in some embodiments, the mask layer 202b and the pad layer 202a which are not covered by the patterned photoresist layer 204 are sequentially etched to form a patterned mask layer 202b' and a patterned pad layer 202a', and the underlying semiconductor substrate 200 is exposed. By using the patterned mask layer 202b', the patterned pad layer 202a', and the patterned photoresist layer 204 as a mask, portions of the semiconductor substrate 200 are exposed and etched to form trenches 206 and semiconductor fins 208. The semiconductor fins 208 are covered by the patterned mask layer 202b', the patterned pad layer 202a', and the patterned photoresist layer 204. Two adjacent trenches 206 are spaced apart by a spacing. In other words, two adjacent trenches 206 are spaced apart by a corresponding semiconductor fin 208, and each of the semiconductor fins 208 is located between two adjacent trenches 206. After the trenches 206 and the semiconductor fins 208 are formed, the patterned photoresist layer 204 is then removed. In some embodiments, a cleaning process may be performed to remove native oxides of the semiconductor substrate 200a and the semiconductor fins 208. The cleaning process may be performed using diluted hydrofluoric (DHF) acid or other suitable cleaning solutions. In FIG. 1B and FIG. 2B, two semiconductor fins 208 are shown for illustration purpose, and the disclosure is not limited thereto. In other embodiments, the number of the semiconductor fins 208 may be one or more than one.

Figure 2C:
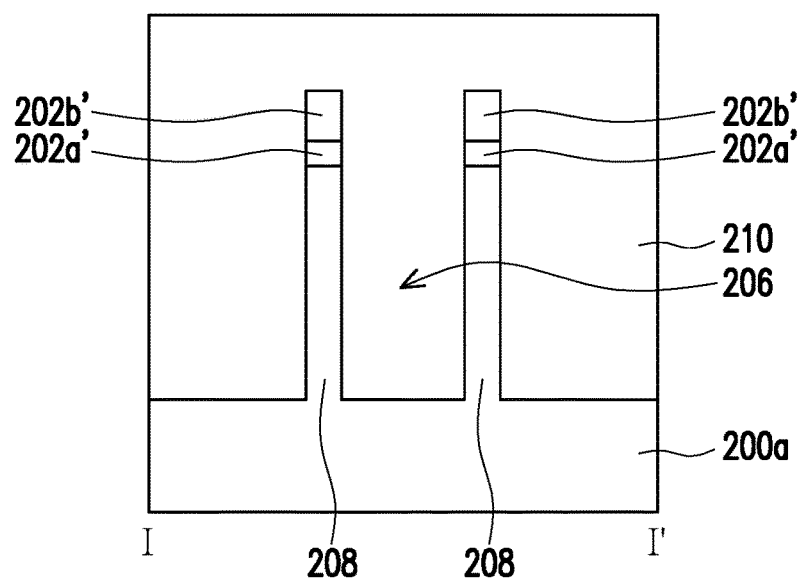

Referring to FIG. 1C and FIG. 2C, in some embodiments, an insulating material 210 is formed over the semiconductor substrate 200a to cover the semiconductor fins 208 and to fill up the trenches 206. In addition to the semiconductor fins 208, the insulating material 210 further covers the patterned pad layer 202a' and the patterned mask layer 202b'. The insulating material 210 may include silicon oxide, silicon nitride, silicon oxynitride, silicon carbonitride, silicon carbide oxynitride, a spin-on dielectric material (such as spin-on glass (SOG)), or a low-K dielectric material. It should be noted that the low-K dielectric materials are generally dielectric materials having a dielectric constant lower than 3.9. The insulating material 210 may be formed by high-density-plasma chemical vapor deposition (HDP-CVD), sub-atmospheric CVD (SACVD), or spin-on coating.

Figure 2D:
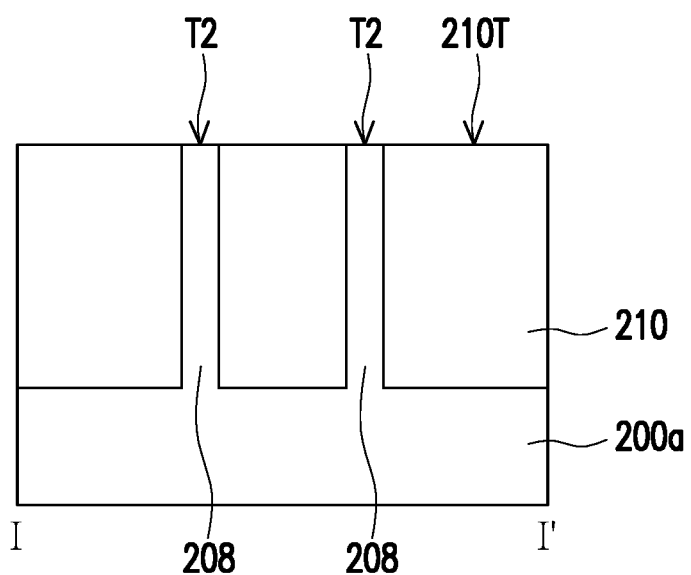

Referring to FIG. 1D and FIG. 2D, in some embodiments, a chemical mechanical polish (CMP) process is, for example, performed to remove the patterned mask layer 202b', the patterned pad layer 202a', and a portion of the insulating material 210 until the semiconductor fins 208 are exposed. As shown in FIG. 1D and FIG. 2D, after the insulating material 210 is polished, a top surface 210T of the polished insulating material 210 is substantially coplanar with top surfaces T2 of the semiconductor fins 208.

Figure 2E:
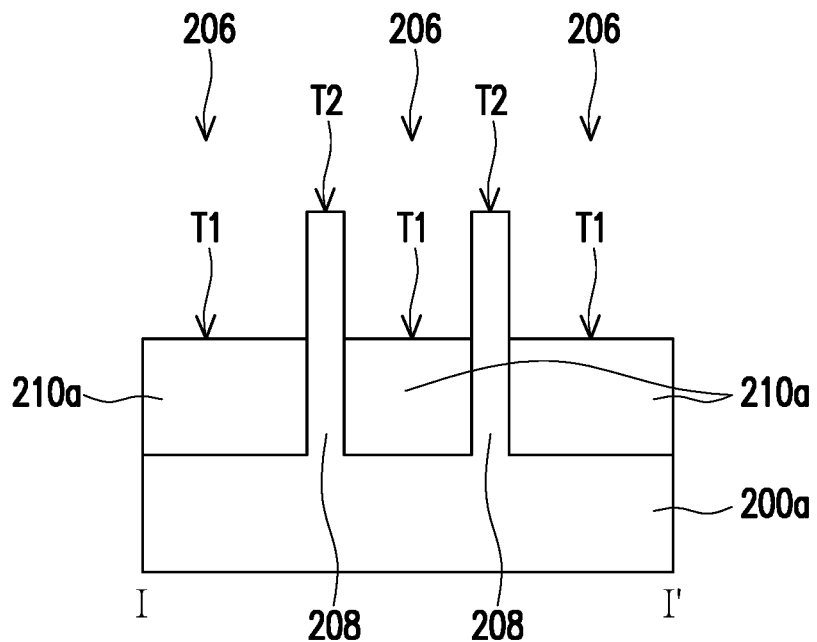

Referring to FIG. 1E and FIG. 2E, in some embodiments, the polished insulating material 210 filled in the trenches 206 is partially removed by an etching process such that insulators 210a are formed on the semiconductor substrate 200a. In some embodiments, each insulator 210a is located between two adjacent semiconductor fins 208. In other words, the insulators 210a are located in the trenches 206, respectively. In some embodiments, the etching process may be a wet etching process with hydrofluoric acid (HF) or a dry etching process. Top surfaces T1 of the insulators 210a are lower than the top surfaces T2 of the semiconductor fins 208. In other words, the semiconductor fins 208 protrude from the top surfaces T1 of the insulators 210a.

Figure 2F:
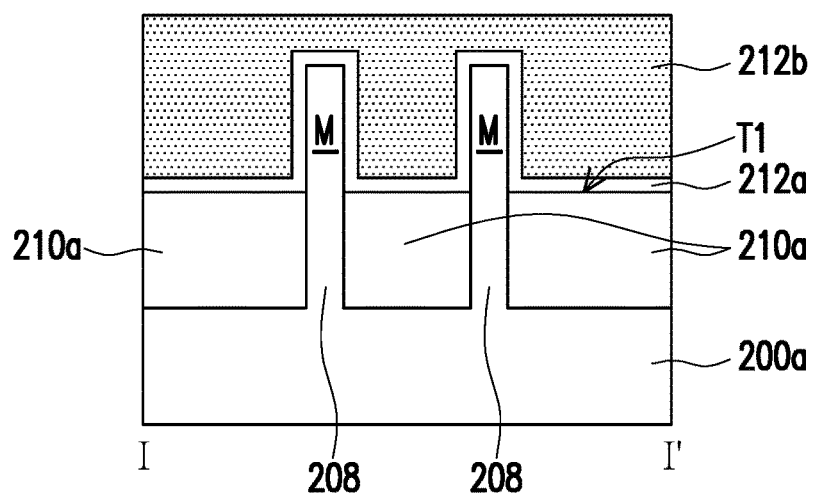

Referring to FIG. 1F and FIG. 2F, in some embodiments, at least one dummy gate stack 212 is formed over portions of the semiconductor fins 208 and portion of the insulators 210a. In some embodiments, as shown in FIG. 1F and FIG. 2F, two dummy gate stacks 212, which are also denoted as a dummy gate stack 212R and a dummy gate stack 212L, are shown for illustration purpose, but the disclosure is not limited thereto. In one embodiment, the number of the dummy gate stacks 212 may be one or more than one. In some embodiments, the extending direction D1 of the dummy gate stacks 212 (e.g. the dummy gate stacks 212R and 212L) is, for example, perpendicular to the extension direction D2 of the semiconductor fins 208 so as to cover portions M of the semiconductor fins 208. Each of the dummy gate stacks 212 (e.g. the dummy gate stacks 212R and 212L) includes a dummy gate dielectric layer 212a and a dummy gate 212b disposed over the dummy gate dielectric layer 212a. For example, the dummy gates 212b of the dummy gate stacks 212 are disposed over the portions M of the semiconductor fins 208 and over portions of the insulators 210a.

The dummy gate dielectric layers 212a of the dummy gate stacks 212 are formed to cover the portions M of the semiconductor fins 208, in some embodiments. In some embodiments, the dummy gate dielectric layers 212a may include silicon oxide, silicon nitride, silicon oxynitride, silicon carbonitride, silicon carbide oxynitride, a spin-on dielectric material, or a low-K dielectric material. The dummy gate dielectric layers 212a may be formed using a suitable process such as HDP-CVD, SACVD, or spin-on coating, or the like. The dummy gates 212b of the dummy gate stacks 212 are, for example, then formed on the dummy gate dielectric layers 212a, respectively. In some embodiments, the dummy gates 212b each may include a single layer or multi-layered structure. In some embodiments, the dummy gates 212b may include a silicon-containing material, such as poly-silicon, amorphous silicon or a combination thereof. The dummy gates 212b may be formed using a suitable process such as atomic layer deposition (ALD), chemical vapor deposition (CVD), physical vapor deposition (PVD), plating, or combinations thereof.

In addition, each of the dummy gate stacks 212 (e.g. the dummy gate stacks 212R and 212L) may further include a pair of spacers 212c disposed on sidewalls of the dummy gate dielectric layer 212a and the dummy gate 212b. The pair of spacers 212c may further cover portions of a respective one of the semiconductor fins 208. The spacers 212c are formed of dielectric materials, such as silicon oxide, silicon nitride silicon oxynitride, silicon carbonitride, silicon carbide oxynitride, a spin-on dielectric material (e.g. SOG), or a low-K dielectric material, in some embodiments. In certain embodiments, the materials of the spacers 212c may be the same as the materials of the gate dielectric layers 212a, the disclosure is not limited thereto. The spacers 212c may include a single layer or multilayer structure.

In some embodiments, portions of the semiconductor fins 208 that are not covered by the dummy gate stacks 212 are referred to as exposed portions E (shown in FIG. 1F) hereinafter. In some embodiments, the exposed portions E of the semiconductor fins 208 located at two opposite sides of one of the dummy gate stacks 212 (e.g. the dummy gate stacks 212R and 212L) constitute source/drain regions 220 of the semiconductor fins 208 with respect to the respective one of the dummy gate stacks 212. In one embodiment, each of the semiconductor fins 208 covered by the dummy gate stacks 212 (e.g. the dummy gate stacks 212R and 212L) may have its own source/drain regions 220 located at two opposite sides of a respective one of the dummy gate stacks 212. In other words, for example, each of the dummy gate stacks 212 has its own source/drain regions 220, and none of the source/drain regions 220 of the semiconductor fins 208 is commonly shared by any two adjacent dummy gate stacks 212. However, the disclosure is not limited thereto.

In an alternative embodiment, as shown in FIG. 1F and FIG. 2F, the exposed portions E of the semiconductor fins 208 located between two adjacent dummy gate stacks 212 may simultaneously constitute the source/drain regions 220 of the dummy gate stacks 212 (e.g. the dummy gate stacks 212R and 212L), which is shared by the dummy gate stacks 212 (e.g. the dummy gate stacks 212R and 212L). In other words, the source/drain regions 220 sandwiched between the semiconductor fins 208 covered by the dummy gate stacks 212R and the semiconductor fins 208 covered by the dummy gate stacks 212L are commonly shared by the dummy gate stacks 212R and the dummy gate stacks 212L. Noted that, the source/drain regions 220 commonly shared by the two adjacent dummy gate stacks, the dummy gate stacks 212R and the dummy gate stacks 212L, is referred to as the shared source/drain regions 220S.

Figure 2G:
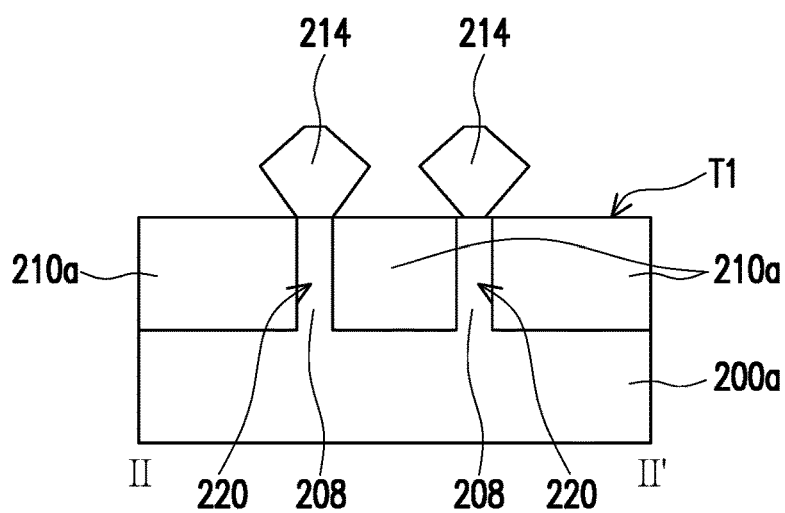

Referring to FIG. 1G and FIG. 2G, in some embodiments, strained materials 214 are grown over the exposed portions E of the semiconductor fins 208 to strain or stress the semiconductor fins 208. In some embodiments, the strained materials 214 are grown on the exposed portions E of the semiconductor fins 208 at two opposite sides of one of the dummy gate stacks 212 (e.g. the dummy gate stacks 212R and 212L). For example, the strained materials 214 are located at two opposite sides of the dummy gate stacks 212R and 212L, where some of the strained materials 214 are located between the dummy gate stacks 212R and 212L. In other words, some of the strained materials 214 are formed over the source/drain regions 220 of the semiconductor fins 208 to serve as the source of a semiconductor device or the drain of a semiconductor device while some of the strained materials 214 are formed over the shared source/drain regions 220S of the semiconductor fins 208 to serve as the shared source/drain of the respective two adjacent semiconductor devices, as shown in FIG. 1G and FIG. 2G. The strained materials 214 formed over the shared source/drain regions 220S of the semiconductor fins 208 for serving as the shared source/drain may be referred to as the shared strained materials 214S.

However, the disclosure is not limited thereto; and in an alternative embodiment, some of the strained materials 214 may be considered as a source of the semiconductor device while some of the strained materials 214 may be considered as a drain of the semiconductor device, where there is no shared source/drain for two adjacent semiconductor devices. In other words, each of the semiconductor fins 208 covered by the dummy gate stacks 212 (e.g. the dummy gate stacks 212R and 212L) may have its own corresponding strained materials 214 located at two opposite sides of a respective one of the dummy gate stacks 212, thus such semiconductor device may have its own source and drain.

The strained materials 214 may be doped with a conductive dopant. In some embodiments, the strained materials 214, such as SiGe, are epitaxial-grown with a p-type dopant for straining a p-type FinFET. That is, the strained materials 214 are doped with the p-type dopant to be the source and the drain of the p-type FinFET. The p-type dopant includes boron or $BF_2$, and the strained materials 214 may be epitaxial-grown by LPCVD process with in-situ doping. However, the disclosure is not limited thereto. In some alternative embodiments, the strained materials 214, such as SiC, are epitaxial-grown with an n-type dopant for straining an n-type FinFET. That is, the strained materials 214 are doped with the n-type dopant to be the source and the drain of the n-type FinFET. The n-type dopant includes arsenic and/or phosphorus, and the strained materials 214 may be epitaxial-grown by LPCVD process with in-situ doping. In some embodiments, the strained materials 214 are grown to have substantially identical size. For example, the strained materials 214 may be symmetrical to one another. However, the disclosure is not limited thereto. In some alternative embodiments, the strained materials 214 may be grown to have different sizes. In some embodiments, the strained materials 214 located at the same side of the dummy gate stacks 212 may be grown to physically connected to each other, which may be considered as an integral piece.

In some embodiments, before the formation of the strained materials 214, the exposed portions E of the semiconductor fins 208 may be planarized to the top surfaces T1 of the insulators 210a, and thus top surfaces of the exposed portions E of the semiconductor fins 208 substantially leveled with and substantially coplanar to the top surfaces T1 of the insulators 210a, as shown FIG. 1G and FIG. 2G. It should be noted that the method shown in FIG. 1G and FIG. 2G is merely an exemplary illustration for forming the strained materials 214, and the disclosure is not limited thereto. In some alternative embodiments, the exposed portions E of the semiconductor fins 208 may be recessed below the top surfaces T1 of the insulators 210a, and the strained materials 214 may be grown from the recessed portion and extend beyond the top surfaces T1 of the insulators 210a to strain or stress the semiconductor fins 208. In further embodiments, the exposed portions E of the semiconductor fins 208 may be remained the same, and the strained materials 214 may be grown over the exposed portions E of the semiconductor fins 208 to cover top surfaces and at least portions of sidewalls of the exposed portions E of the semiconductor fins 208.

Figure 2H:
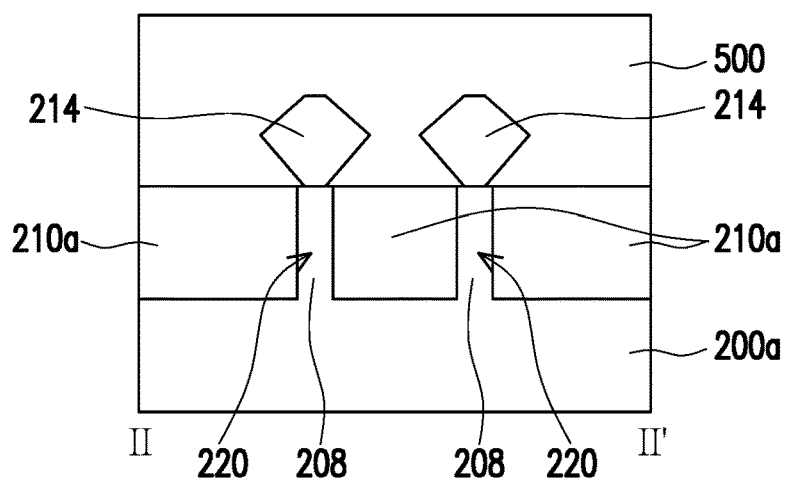

Referring to FIG. 1H and FIG. 2H, in some embodiments, an interlayer dielectric (ILD) layer 500 is formed over the insulators 210a to cover the strained materials 214. In other words, the interlayer dielectric layer 500 is formed adjacent to the spacers 212c, for example. The interlayer dielectric layer 500 includes silicon oxide, silicon nitride, silicon oxynitride, silicon carbonitride, silicon carbide oxynitride, SOG, phosphosilicate glass (PSG), borophosphosilicate glass (BPSG), fluorinated silica glass (FSG), carbon doped silicon oxide (e.g., SiCOH), polyimide, and/or a combination thereof. In some alternative embodiments, the interlayer dielectric layer 500 may include low-K dielectric materials.

Examples of low-K dielectric materials include BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof. It is understood that the interlayer dielectric layer 500 may include one or more dielectric materials. In some embodiments, the interlayer dielectric layer 500 is formed to a suitable thickness by Flowable CVD (FCVD), CVD, HDPCVD, SACVD, spin-on, sputtering, or other suitable methods. For example, an interlayer dielectric material layer (not illustrated) is formed to cover the insulators 210a and the dummy gate stacks 212 first, then the thickness of the interlayer dielectric material layer is reduced until top surfaces of the dummy gate stacks 212 are exposed, so as to form the interlayer dielectric layer 500. The thickness of the interlayer dielectric material layer may be reduced by a CMP process, an etching process, or other suitable process. As shown in FIG. 1H, the interlayer dielectric layer 500 fills up the gaps between the spacers 212c, between the strained materials 214, and between the spacers 212c and the strained materials 214.

Figure 2I:
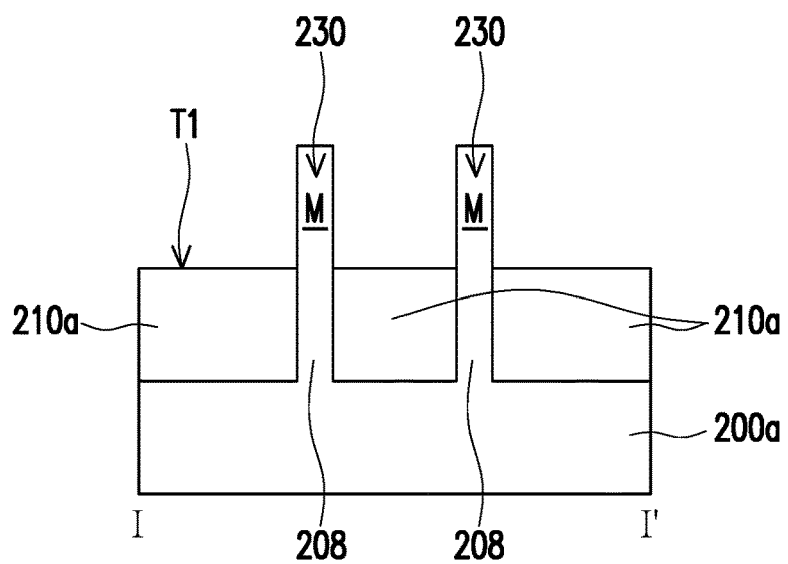

Referring to FIG. 1I and FIG. 2I, in some embodiments, portions of the dummy gate stacks 212 are removed to form hollow portions H exposing portions of the semiconductor fins 208. For example, the dummy gate dielectric layers 212a and the dummy gates 212b are removed, and the hollow portions H expose part of the portions M of the semiconductor fins 208. It should be noted that each portion of the semiconductor fins 208 exposed by the hollow portions H may act as a channel region 230.

In some embodiments, the dummy gate dielectric layers 212a and the dummy gates 212b are removed through an etching process or other suitable processes. For example, the dummy gate dielectric layers 212a and the dummy gates 212b may be removed through wet etching or dry etching. Example of wet etching includes chemical etching and example of dry etching includes plasma etching, but the disclosure is not limited thereto. Other commonly known etching method may also be adapted to perform the removal of the dummy gate dielectric layers 212a and the dummy gates 212b.

Figure 2J:
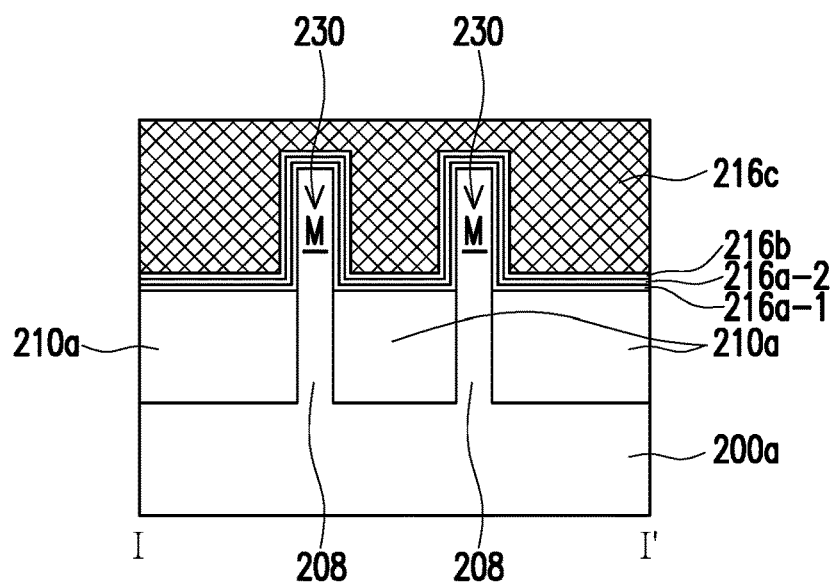

Referring to FIG. 1J and FIG. 2J, in some embodiments, an oxide dielectric layer 216a-1, a high-k dielectric layer 216a-2, a work function layer 216b, and a metal layer 216c are sequentially deposited into each of the hollow portions H to form gate stacks 216. In some embodiments, as shown in FIG. 1J and FIG. 2J, two gate stacks 216, which are also denoted as a gate stack 216R and a gate stack 216L, are shown for illustration purpose, but the disclosure is not limited thereto. In one embodiment, the number of the gate stacks 216 may be one or more than one, and may be less than or equal to the number of the dummy stacks 212. In some embodiments, the metal layer 216c is referred to as a gate electrode layer of one gate stack 216, while the oxide dielectric layer 216a-1 and the high-k dielectric layer 216a-2 are together referred to as a gate dielectric layer of the gate electrode layer. As shown in FIG. 1J, along the direction D2, a cross-sectional view of each of the oxide dielectric layer 216a-1, the high-k dielectric layer 216a-2, and the work function layer 216b is in a form of a U-shape surrounding the metal layer 216c.

In some embodiments, the gate stacks 216 are disposed over the semiconductor fins 208 and on the insulators 210a. The strained materials 214 are located at two opposite sides of each of the gate stacks 216, where some of the strained materials 214 are located between two adjacent gate stacks 216 (e.g. the gate stack 216R and the gate stack 216L), for example. In some embodiments, each of the gate stacks 216 (e.g. the gate stack 216R and the gate stack 216L) includes the oxide dielectric layer 216a-1, the high-k dielectric layer 216a-2, the work function layer 216b, and the metal layer 216c. In each of the hollow portions H, the oxide dielectric layer 216a-1 are respectively disposed over the channel regions 230 of the semiconductor fins 208, and the high-k dielectric layer 216a-2 is disposed on the oxide dielectric layer 216a-1, where the oxide dielectric layer 216a-1 is sandwiched between the insulators 210a and the high-k dielectric layer 216a-2 and between the channel regions 230 of the semiconductor fins 208 and the high-k dielectric layer 216a-2. For example, a material of the oxide dielectric layer 216a-1 may be silicon dioxide ($SiO_2$) and may be formed using a suitable process such as ALD, CVD, or the like, while a material of the high-k dielectric layer 216a-2 may be a high k dielectric materials, for example, metal oxides, such as HfO, ZrO, AlO, or the like. In some embodiments, each of the hollow portions H, the work function layer 216b is disposed on the high-k dielectric layer 216a-2, and the metal layer 216c is disposed on the work function layer 216b, where the high-k dielectric layer 216a-2 is located between the oxide dielectric layer 216a-1 and the work function layer 216b, and the work function layer 216b is located between the high-k dielectric layer 216a-2 and the metal layer 216c. In one embodiment, a material of the metal layer 216c includes metal, metal alloy, or metal nitride. For example, in some embodiments, the metal layer 216c may include TiN, WN, TaN, Ru, Ti, Ag, Al, TiAl, TiAlN, TaC, TaCN, TaSiN, Mn, or Zr. In some embodiments, a material of the work function layer 216b may include p-type work function metals, such as TiN, TaN, Ru, Mo, Al, WN, $ZrSi_2$, $MoSi_2$, TaSiz, $NiSi_2$, WN, other suitable p-type work function materials, or combinations thereof. In some embodiments, the material of the work function layer 216b may include n-type work function metals, such as Ti, Ag, TaAl, TaAlC, TiAlN, TaC, TaCN, TaSiN, Mn, Zr, other suitable n-type work function materials, or combinations thereof. In some embodiments, the method of forming the work function layer 216b includes performing at least one suitable deposition technique (such as CVD, PECVD. ALD, emote plasma atomic layer deposition (RPALD), plasma-enhanced atomic layer deposition (PEALD), molecular beam deposition (MBD), or the like) and at least one suitable patterning technique (such as photolithography and etching processes). In some embodiments, the work function layer 216b may serve the purpose of adjusting threshold voltage (Vt) of the semiconductor device.

In some embodiments, each of the gate stacks 216 may further include a barrier layer (not shown). For example, the barrier layer has a U-shape cross-section similar to the oxide dielectric layer 216a-1, the high-k dielectric layer 216a-2, and the work function layer 216b along the direction D2, where the barrier layer is sandwiched between the work function layer 216b and the metal layer 216c. In some embodiments, the barrier layer is able to block the impurities (e.g. fluorine impurities) from diffusing into the work function layer, thereby avoiding shift in the threshold voltage of the semiconductor device. In some embodiments, a liner layer, a seed layer, an adhesion layer, or a combination thereof may be included between the metal layer 216c of the gate stacks 216 and the semiconductor fins 208.

Figure 2K:
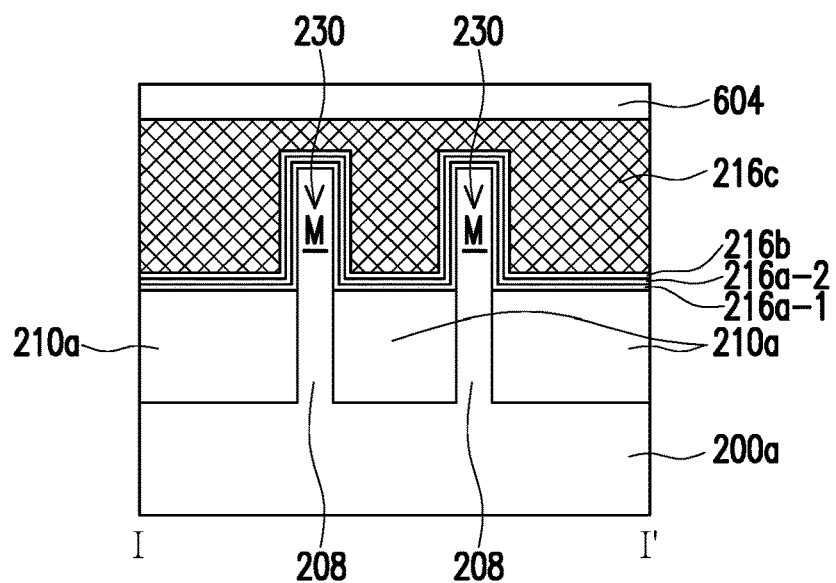

Referring to FIG. 1K and FIG. 2K, in some embodiments, a hard mask layer 604 is formed over the gate stacks 216 and extended into the hollow portions H. For example, in each hollow portion H along the direction D2, the hard mask layer 604 has a T-shaped cross-section, where the hard mask layer 604 is in contact with top surfaces of the oxide dielectric layer 216a-1, the high-k dielectric layer 216a-2, the work function layer 216b, the metal layer 216c, and the spacers 212c. In some embodiments, the hard mask layer 604 includes silicon oxynitride (SiON), silicon carbon nitride (SiCN), or high-K dielectrics. High-K dielectrics includes metal oxides. It should be noted that the high-K dielectric materials are generally dielectric materials having a dielectric constant greater than 4. Examples of metal oxides used for high-K dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. The hard mask layer 604 may be formed using a suitable process such as ALD, CVD, PVD, thermal oxidation, UV-ozone oxidation, or combinations thereof.

Figure 2L:
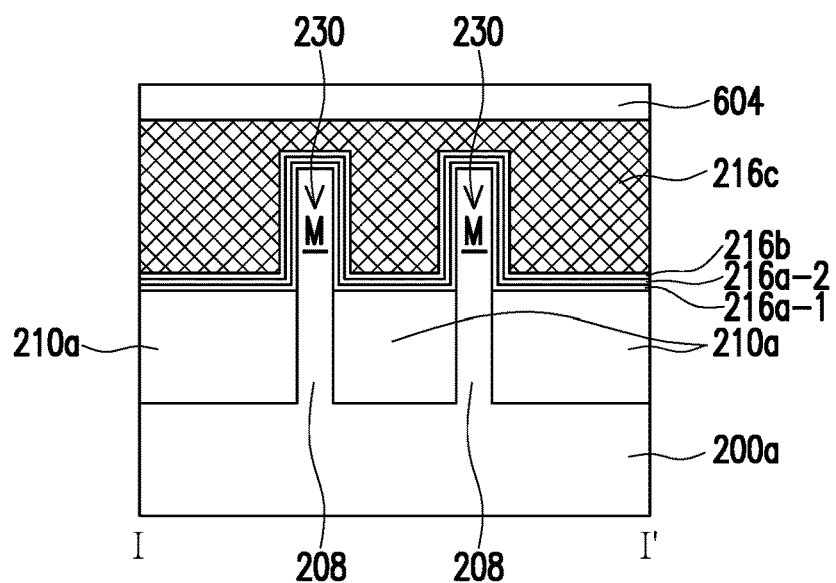

Referring to FIG. 1L and FIG. 2L, in some embodiment, the interlayer dielectric layer 500 is removed to expose the trenches 206, the insulators 210a, and the strained materials 214, and a silicide layer 400 is then conformally formed on exposed surfaces of the strained materials 214. The removal of the interlayer dielectric layer 500 may be performed by at least one suitable etching technique, the disclosure is not limited thereto. In some embodiments, as shown in FIG. 1L, the silicide layer 400 is conformally formed to be corresponding to the profiles of the strained materials 214. In some embodiments, the silicide layer 400 may be conformally formed to be corresponding to the profiles of the trenches 206, the insulators 210a, and the strained materials 214. The silicide layer 400 may be formed of silicide materials and may be formed by PVD, CVD, and ALD. As shown in FIG. 1L and FIG. 2L, the silicide layer 400 wraps around the strained materials 214.

Figure 2M:
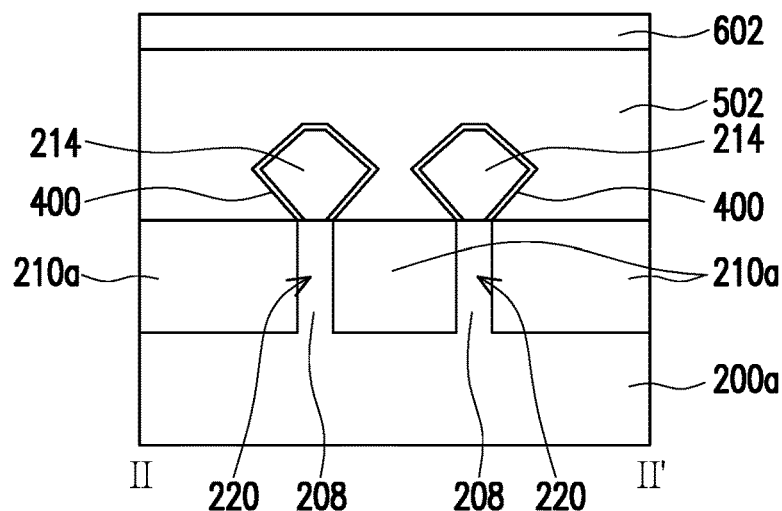

Referring to FIG. 1M and FIG. 1M, in some embodiments, an interlayer dielectric layer 502 and an interlayer dielectric layer 602 are sequentially deposited over the gate stacks 216 and the silicide layer 400. In some embodiments, the interlayer dielectric layer 502 is formed over the insulators 210a to cover the silicide layer 400 and the strained materials 214. In other words, the interlayer dielectric layer 502 is formed adjacent to the spacers 212c and filled up the gaps between the gate stacks 216 and the strained materials 214, for example. The formation and material of the interlayer dielectric layer 502 is similar to the formation and material of the interlayer dielectric layer 500, and thus may not be repeated herein. In some embodiments, a surface of the interlayer dielectric layer 602 is formed over the interlayer dielectric layer 502 and is substantially levelled with and coplanar to a surface of the hard mask layer 604. As shown in FIG. 1M and FIG. 2M, for example, the interlayer dielectric layer 602 covers the silicide layer 400 and the strained materials 214 wrapped by the silicide layer 400. In some embodiments, the interlayer dielectric layer 602 may include silicon oxide, silicon nitride, silicon oxynitride, PSG, BPSG, SOG, FSG, polyimide, and/or a combination thereof. In some alternative embodiments, the interlayer dielectric layer 602 may include low-K dielectric materials. Examples of low-K dielectric materials include BLACK DIAMOND® (Applied Materials of Santa Clara, Calif.), Xerogel, Aerogel, amorphous fluorinated carbon, Parylene, BCB, Flare, SILK® (Dow Chemical, Midland, Mich.), HSQ or SiOF, and/or a combination thereof. It is understood that the interlayer dielectric layer 602 may include one or more dielectric materials. In some embodiments, the interlayer dielectric layer 602 may be formed to a suitable thickness by FCVD, CVD, HDPCVD, SACVD, spin-on, sputtering, or other suitable methods, and may be patterned to have the openings O1 through photolithography and etching processes. The disclosure is not specifically limited thereto. In some embodiments, the materials of the interlayer dielectric layer 602 may be the same as the materials of the interlayer dielectric layer 500, the interlayer dielectric layer 502, and the spacers 212c. In some embodiments, the materials of the interlayer dielectric layer 602 may be different from the materials of the interlayer dielectric layer 500, the interlayer dielectric layer 502, and the spacers 212c.

Figure 2N:
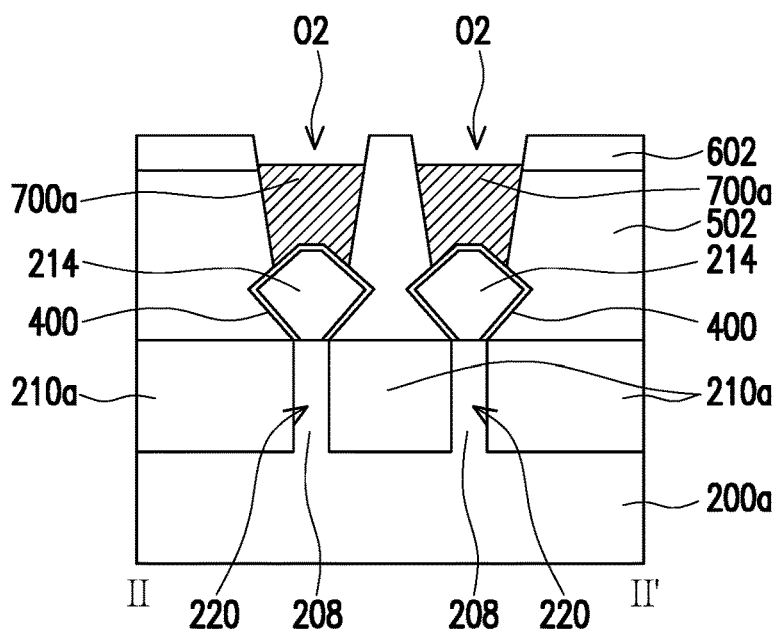
Figure 10:
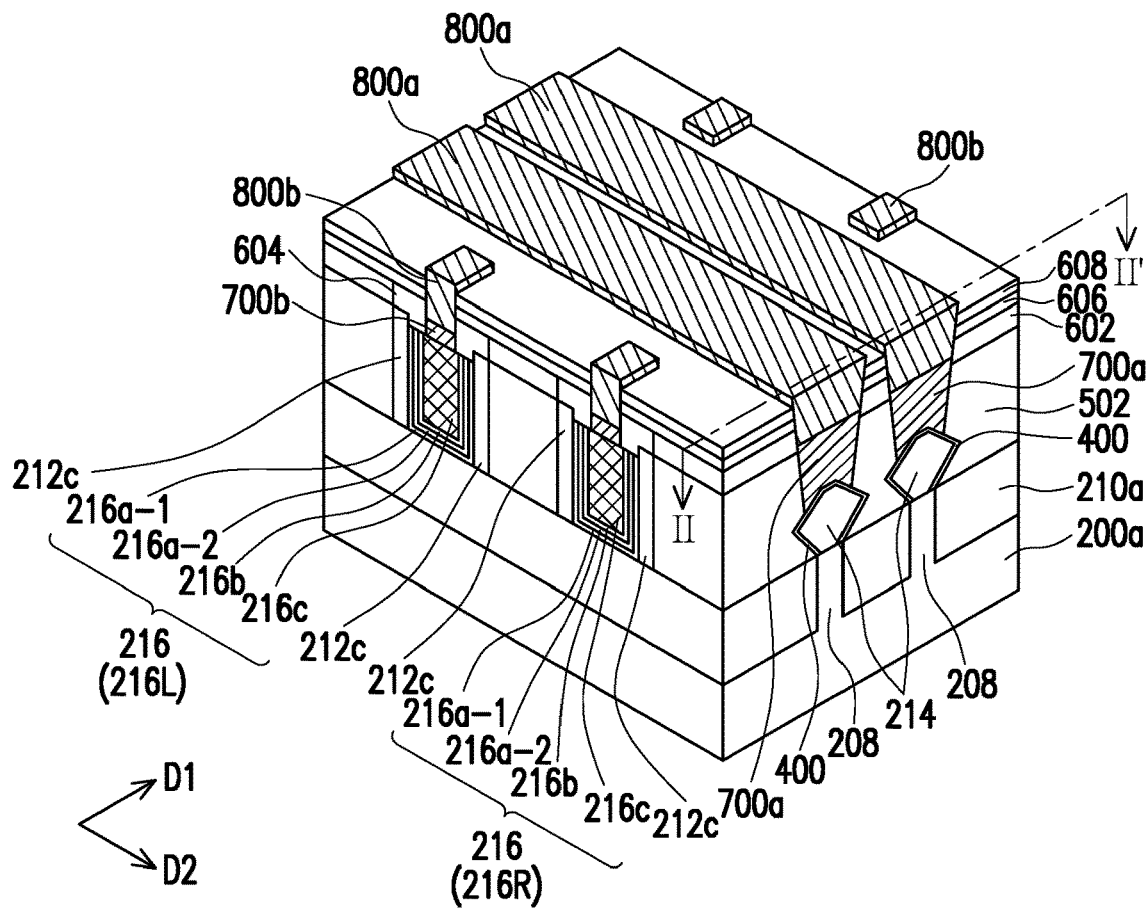
Figure 20:
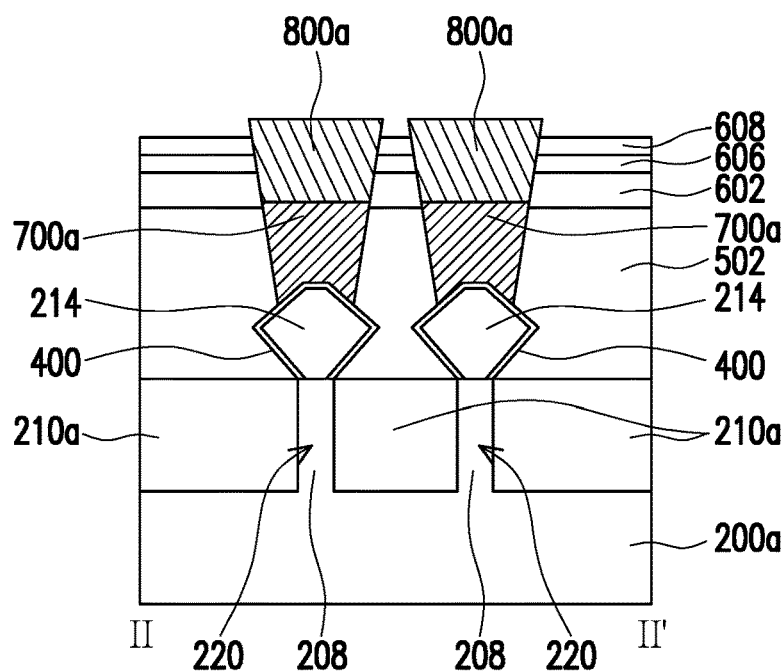

Referring to FIG. 1N and FIG. 2N, in some embodiments, a plurality of openings O2 are formed in the interlayer dielectric layer 602 and the interlayer dielectric layer 502 and a plurality of openings O3 are formed in the hard mask layer 604, and the conductive vias 700a and the conductive vias 700b are formed in the openings O2 and the openings O3 respectively. In some embodiments, as shown in FIG. 1N and FIG. 2N, six openings O2 and two openings O3 are shown for illustration purpose, but the disclosure is not limited thereto. In one embodiment, the number of the openings O2 and the number of the openings O3 may be one or more than one.

For example, the openings O2 each penetrate through the entire interlayer dielectric layer 602 and a portion of the interlayer dielectric layer 502 to at least partially expose the silicide layers 400. In some embodiments, the locations of the openings O2 correspond to the locations of the strained materials 214. In some embodiments, the openings O2 expose at least a portion of the silicide layers 400 located on the strained materials 214 at the source/drain regions 220 (including the shared source/drain regions 220S). Thereafter, conductive vias 700a are formed in the openings O2 to physically connect to the exposed silicide layers 400 located on the strained materials 214. In certain embodiments, the conductive vias 700a are considered as source/drain contacts of the semiconductor device. In some embodiments, the conductive vias 700a are electrically connected to the strained materials 214 through a respective one silicide layer 400, respectively. For example, as shown in FIG. 1N and FIG. 2N, the silicide layers 400 located on the strained materials 214 are directly in contact with the conductive vias 700a.

In some embodiments, the conductive vias 700a are formed in the openings O2 respectively, where top surfaces of the conductive vias 700a are above the top surface of the interlayer dielectric layer 502 and below the top surface of the interlayer dielectric layer 602, as shown in FIG. 1N and FIG. 2N. However, the disclosure is not limited thereto. In one embodiment, the conductive vias 700a may be formed in the openings O2 respectively, where the top surfaces of the conductive vias 700a are above the top surface of the interlayer dielectric layer 502 and substantially levelled with the top surface of the interlayer dielectric layer 602 (see FIG. 4A and FIG. 5A). In an alternative embodiment, the conductive vias 700a may be formed in the openings O2 respectively, where the top surfaces of the conductive vias 700a are below the top surface of the interlayer dielectric layer 502 and below the top surface of the interlayer dielectric layer 602. In a further alternative embodiment, the conductive vias 700a may be formed in the openings O2 respectively, where the top surfaces of the conductive vias 700a are substantially levelled with the top surface of the interlayer dielectric layer 502 and below the top surface of the interlayer dielectric layer 602.

For example, the openings O3 each penetrate through the entire hard mask layer 604 to expose portions of the metal layers 216c of the gate stacks 216. In some embodiments, the locations of the openings O3 correspond to the locations of the metal layers 216c. In some embodiments, the openings O3 at least expose portions of the metal layers 216c. Thereafter, conductive vias 700b are formed in the openings O3 to physically connect to the exposed metal layers 216c. In certain embodiments, the conductive vias 700b are considered as gate contacts of the semiconductor device. In some embodiments, the conductive vias 700b are electrically connected to the exposed metal layers 216c, respectively. For example, the exposed metal layers 216c of the gate stacks 216 are directly in contact with the conductive vias 700b, as shown in FIG. 1M.

In some embodiments, the conductive vias 700b are partially filled the openings O3 respectively, where top surfaces of the conductive vias 700b are below the top surface of the hard mask layer 604 as shown in FIG. 1N. However, the disclosure is not limited thereto; in an alternative embodiment, the conductive vias 700b may fill up the openings O3 with the top surfaces substantially levelled with the top surface of the hard mask layer 604. In an alternative embodiment, the conductive vias 700b may be formed in the openings O3 respectively, where the top surfaces of the conductive vias 700b are above the top surface of the hard mask layer 604.

The openings O2 and the openings O3 may be formed by photolithography and etching processes. In some embodiments, the openings O2 and the openings O3 are formed in different steps. In some embodiments, the conductive vias 700a and 700b may include copper, copper alloys, nickel, aluminum, manganese, magnesium, silver, gold, tungsten, a combination of thereof, or the like. The conductive via 700a and 700b may be formed by, for example, electro-chemical plating process, CVD, PECVD, ALD, PVD, a combination thereof, or the like.

Referring to FIG. 1O and FIG. 2O, in some embodiments, an interlayer dielectric layer 606 is formed on the conductive vias 700a/the conductive vias 700b, the interlayer dielectric layer 602, and the hard mask layer 604, where the interlayer dielectric layer 606 fills up the openings O2 and the openings O3 respectively formed in the interlayer dielectric layers 502/602 and the hard mask layer 604. In certain embodiments, the interlayer dielectric layer 606 serves as a passivation film and/or a protection film for the semiconductor device. Due to the interlayer dielectric layer 606, a high degree of coplanarity and flatness is provided, the formation of the later-formed layer(s) is beneficial.

In one embodiments, a material of the interlayer dielectric layer 606 may include silicon oxide, silicon nitride, silicon oxynitride, PSG, BPSG, SOG, FSG, SiCOH, polyimide, and/or a combination thereof. In some alternative embodiments, the interlayer dielectric layer 606 may include low-K dielectric materials. Examples of low-K dielectric materials include BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), HSQ or SiOF, and/or a combination thereof. It is understood that the interlayer dielectric layer 606 may include one or more dielectric materials. In some embodiments, the interlayer dielectric layer 606 may be formed to a suitable thickness by FCVD, CVD, HDPCVD, SACVD, spin-on, sputtering, or other suitable methods. The materials of the interlayer dielectric layer 606 may be the same as the materials of the interlayer dielectric layer 500, the interlayer dielectric layer 502, and the spacers 212c, in one embodiment. However, in an alternative embodiment, the materials of the interlayer dielectric layer 606 may be different from the materials of the interlayer dielectric layer 500, the interlayer dielectric layer 502, and the spacers 212c.

In some embodiments, a plurality of openings (not shown) are formed in the interlayer dielectric layer 606 to exposed the conductive vias 700a and the conductive vias 700b. For example, the openings may be formed by photolithography and etching processes. In some embodiments, the number and shape of the openings is not limited in the disclosure, and may be selected and designated based on the demand. In some embodiments, the locations of the openings correspond to the locations of the conductive vias 700a and the conductive vias 700b, respectively. In some embodiments, the openings each penetrate through the interlayer dielectric layer 606, the hard mask layer 604, and/or the interlayer dielectric layer 602 to expose the top surfaces of the conductive vias 700a and the conductive vias 700b for electrically connecting to a later-formed element (e.g. a conductive element providing a routing function, or the like).

In some embodiments, an interlayer dielectric layer 608 is formed on the interlayer dielectric layer 606, where portions of the interlayer dielectric layer 606 are exposed by recesses (not shown) formed in the interlayer dielectric layer 608, and the recesses formed in the interlayer dielectric layer 608 are spatially communicated with the openings exposing the conductive vias 700a and 700b. In some embodiments, the formations and material of the interlayer dielectric layer 608 and the recesses are similar to the formations and material the interlayer dielectric layer 606 and the openings formed therein, and thus may not be repeated herein. In some embodiments, the number and shape of the recesses is not limited in the disclosure, and may be selected and designated based on the demand.

Continued on FIG. 1O and FIG. 2O, in some embodiments, a plurality of conductive structures 800a and a plurality of conductive structure 800b are formed on the semiconductor substrate 200a. In some embodiments, the conductive structures 800a and 800b may include copper, copper alloys, nickel, aluminum, manganese, magnesium, silver, gold, tungsten, a combination of thereof or the like. The conductive structures 800a and 800b may be formed by, for example, electro-chemical plating process, CVD, PECVD, ALD, PVD, a combination thereof, or the like. In one embodiment, the conductive structures 800a and 800b may be formed in the same step. In an alternative embodiment, the conductive structures 800a and 800b may be formed in the different steps.

In some embodiments, the conductive structures 800a are formed over the interlayer dielectric layer 608. For example, the conductive structures 800a extend into the recesses formed in the interlayer dielectric layer 608 and further extended into one or more than one of the openings formed in the interlayer dielectric layer 606 and the interlayer dielectric layer 602 to physically connect to the conductive vias 700a. For example, some of the conductive vias 700a are electrically connected to each other through one of the conductive structures 800a, as shown in FIG. 1O. On the other hand, in some embodiments, the conductive structures 800b are formed over the interlayer dielectric layer 608. For example, the conductive structures 800b extend into the recesses formed in the interlayer dielectric layer 608 and further extended into one or more than one of the openings formed in the hard mask layer 604 to physically connect to the conductive vias 700b. For example, some of the conductive vias 700b are electrically connected to each other through one of the conductive structures 800b, as shown in FIG. 1O. With such configuration, the conductive structures 800a along with the conductive vias 700a and the conductive structures 800b along with the conductive vias 700b, for example, are capable of providing the routing function for the semiconductor device.

The numbers of the conductive vias 700a connected to one of the conductive structures 800a and the number of the conductive vias 700b connected to one of the conductive structures 800b are not limited to what is described in FIG. 1O, and may be varied based on the demand and design layout. The number and shape of the conductive structures 800a are not limited to the disclosure; and similarly, the number and shape of the conductive structures 800b are also not limited to the disclosure. In an alternative embodiment, more than one conductive vias 700b may be connected to one of the conductive structure 800b. In a further alternative embodiment, one of the conductive vias 700a may be connected to one of the conductive structure 800a.

Figure 2P:
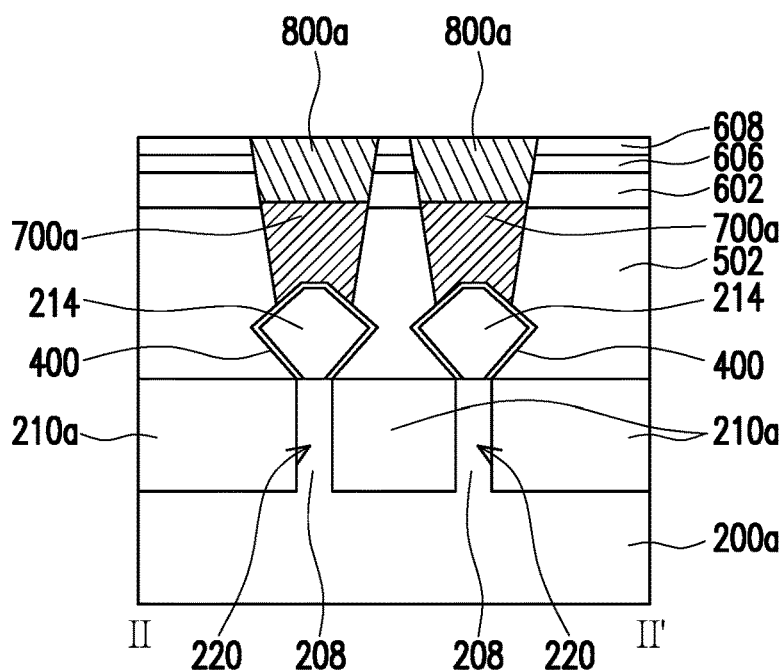

As shown in FIG. 1P and FIG. 2P, in some embodiments, a planarizing process is performed on the conductive structures 800a and the conductive structures 800b to level top surfaces of the conductive structures 800a and the conductive structures 800b with the top surface of the interlayer dielectric layer 608. The planarizing process may include a CMP process, the disclosure is not limited thereto.

Figure 2Q:
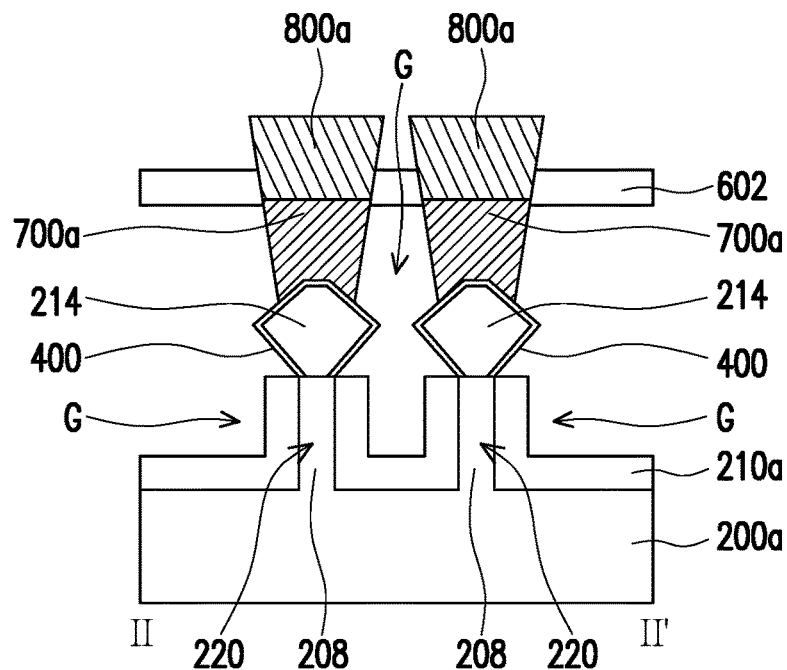

Referring to FIG. 1Q and FIG. 2Q, in some embodiments, a plurality of air gaps G are formed inside the structure depicted in FIG. 1P and FIG. 2P. In some embodiments, some of the air gaps G are formed between two adjacent gate stacks 216 (e.g. the gate stack 216L and the gate stack 216R), and some of the air gaps G are formed between two adjacent strained materials 214 located on a side of one of the gate stacks 216 or sandwiched between two adjacent gate stacks 216, between two adjacent semiconductor fins 208, and between two adjacent conductive vias 700a, as shown in FIG. 1Q and FIG. 2Q. For example, the air gaps G are spatially communicated to one another, which constitute a hollow channel inside the semiconductor device. Due to the air gaps G, an overall parasitic capacitance of the semiconductor device is greatly suppressed, thereby enhancing the electric performance of the semiconductor device.

In some embodiments, the air gaps G may be formed by removing the interlayer dielectric layer 608, the interlayer dielectric layer 606, a portion of the interlayer dielectric layer 602, the interlayer dielectric layer 500, the oxide dielectric layer 216a-1, the spacers 212c, and portions of the insulators 210a by etching. In some embodiments, the etching process may include one or more than one etching processes. For example, the etching process may include wet etching process with hydrofluoric acid (HF), Buffered HF (bHF), Hydrogen Peroxide ($H_2O_2$), Tetramethylammonium hydroxide (TMAH), other suitable etchants, or the like. For example, the interlayer dielectric layer 608 and the interlayer dielectric layer 606 are firstly removed by the same etching step or in different etching steps, and the interlayer dielectric layer 602 is then partially removed by another etching step to form one or more than one through holes (not shown) exposing the underlying interlayer dielectric layer 500, and finally, the interlayer dielectric layer 500, the oxide dielectric layer 216a-1, the spacers 212c, and the portions of the insulators 210a are removed in the same etching step or in different etching steps to form the air gaps G. In other words, the through holes formed in the interlayer dielectric layer 602 are also spatially communicated with the air gaps G. During the above etching processes, the metal elements (e.g. the metal layers 216c, the conductive vias 700a and 700b, and the conductive structures 800a and 800b) and the hard-mask-like elements (e.g. the high-k dielectric layer 216a-2 and the hard mark layer 604) are not removed with respect to the removals of the interlayer dielectric layer 608, the interlayer dielectric layer 606, the portion of the interlayer dielectric layer 602, the oxide dielectric layer 216a-1, the spacers 212c, and the portions of the insulators 210a due to the specific etching selectivity chosen based on the material differences. In some embodiments, the insulators 210a may be completed removed, and sidewalls of the semiconductor fins 208 may be revealed.

However, the disclosure is not limited thereto. In an alternative embodiment, the etching process may include a dry etching process or a combination of dry etching and wet etching processes.

Figure 2R:
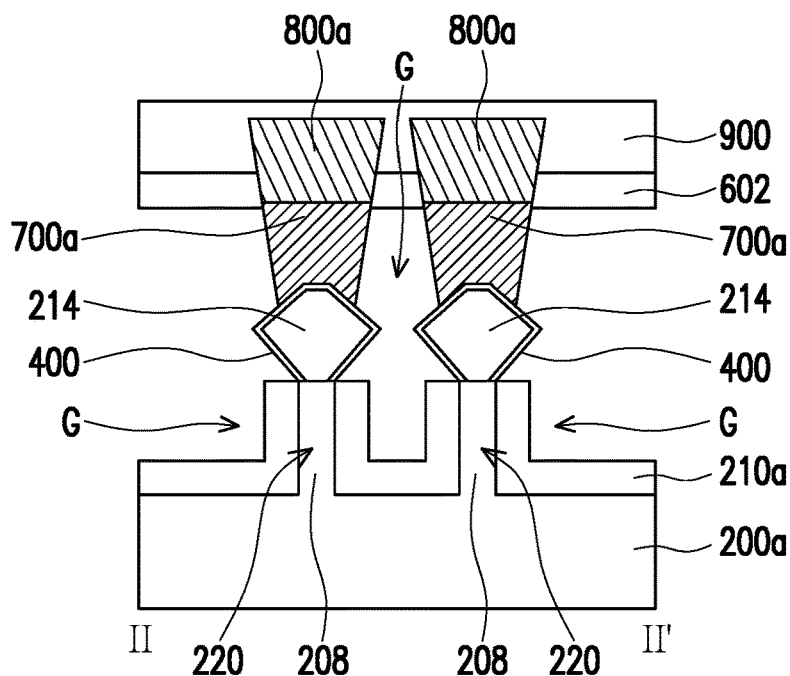

Referring to FIG. 1R and FIG. 2R, in some embodiments, a cap layer 900 is formed over the structure depicted in FIG. 1Q and FIG. 2Q. In some embodiments, the cap layer 900 is formed to cover the structure depicted in FIG. 1Q and FIG. 2Q, where the conductive structures 800a and the conductive structures 800b are completely covered by and embedded in the cap layer 900. In some embodiments, the through holes formed in the interlayer dielectric layer 602, which expose the interlayer dielectric layer 502 to allow the removals of the interlayer dielectric layer 502 and the portions of the insulators 210a by etching, are sealed by the formation of the cap layer 900. The cap layer 900 may include silicon oxide, silicon nitride, silicon oxynitride, PSG, BPSG, SOG, FSG, SiCOH, SiCN, polyimide, and/or a combination thereof, for example. In some alternative embodiments, the cap layer 900 may include low-K dielectric materials. Examples of low-K dielectric materials include BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), HSQ or SiOF, and/or a combination thereof. It is understood that the cap layer 900 may include one or more dielectric materials. In some embodiments, the cap layer 900 is formed by deposition, such as FCVD, CVD, HDPCVD, SACVD or other suitable methods.

For example, as shown in FIG. 1R and FIG. 2R, the cap layer 900 is formed by simultaneously performing a deposition process and an etching process, where the structure depicted in FIG. 1Q and FIG. 2Q is completely covered by the cap layer 900 so as to cover the interlayer dielectric layer 602 and completely seal the opening holes formed in the interlayer dielectric layer 602. That is, no cap layer 900 is present inside the air gaps G. In FIG. 1R and FIG. 2R, for example, the cap layer 900 is not extended into the air gaps G during the formation thereof. For example, the cap layer 900 may be formed by using CVD process while undergoing the etching process with an etchant having a high etching selectivity with respective to the cap layer 900. The etching process may include a wet etching, a dry etching, or a combination thereof, for example.

Owing to the cap layer 900, the semiconductor device is capable of resisting moisture and oxygen from the external environment, thereby ensuring he reliability of the semiconductor device. Due to the deposition process and the etching process are employed in the formation of the cap layer 900, an overall occupied volume ratio of the dielectric elements (e.g. the hard mask layer 604, the remained portion of the interlayer dielectric layer 602, the high-k dielectric layer 216a-2, the work function layer 216b, the remained portion of the insulators 210a, and so on) to the air gaps G in the semiconductor device is significantly reduced, the parasitic capacitance of the semiconductor device is greatly suppressed, thereby enhancing the electric performance of the semiconductor device.

Referring to FIG. 1S and FIG. 2S, in some embodiments, a planarizing process is performed to form a planarized cap layer 900'. For example, the cap layer 900 is planarized to form the planarized cap layer 900' exposing the top surfaces of the conductive structures 800a and the top surfaces of the conductive structures 800b. In some embodiments, a top surface of the planarized cap layer 900' is substantially leveled with the top surface of the conductive structures 800a and the top surfaces of the conductive structures 800b. That is, the top surface of the planarized cap layer 900' is substantially coplanar to the top surface of the conductive structures 800a and the top surfaces of the conductive structures 800b, for example. Due to planarized cap layer 900', the conductive structures 800a and the conductive structures 800b are accessibly exposed and are capable of being electrically connected to other later-formed elements thereon. The cap layer 900' may be planarized by mechanical grinding or CMP, for example. After the planarizing process, a cleaning step may be optionally performed, for example to clean and remove the residue generated from the planarizing process. However, the disclosure is not limited thereto, and the planarizing process may be performed through any other suitable method. Up to here, the semiconductor device (e.g. a FinFET 10) is manufactured.

However, the disclosure is not limited thereto. In some alternative embodiments, instead of simultaneously using a deposition process and an etching process to form the cap layer 900 during the process as described in FIG. 1R and FIG. 2R, an cap layer 1100 is formed over and inside the structure depicted in FIG. 1Q and FIG. 2Q to seal the opening holes formed in the interlayer dielectric layer 602, where the cap layer 1100 is formed by only using a deposition process (such as PVD or or a PVD with ALD); the processes as described in FIG. 1S and FIG. 2S are then sequentially performed to form a FinFET 20 as shown in FIG. 3. As shown in FIG. 3, the cap layer 1100 is formed to further extend into the air gaps G inside the FinFET 20 with respective to the profile of the air gaps G, and a plurality of gaps 1100a are formed therein. For example, the cap layer 1100 is formed by performing a deposition process (such as PVD, PVD and ALD, etc.), where the cap layer 1100 partially fills the air gaps G depicted in FIG. 1Q and FIG. 2Q. The number and shape of the gaps 1100a embedded in the cap layer 1100 inside the air gaps G are not limited, and may be selected and designated based on the demand. The gaps 1100a is, for example, air gaps, the disclosure is not limited thereto.

FIG. 4A to FIG. 4G are perspective views illustrating a manufacturing method of a FinFET in accordance with some embodiments of the disclosure. FIG. 5A to FIG. 5G are cross-sectional views of the FinFET depicted in FIG. 4A to FIG. 4G. FIG. 6 is a cross-sectional view illustrating a FinFET in accordance with some embodiments of the disclosure. The elements similar to or substantially the same as the elements described previously will use the same reference numbers, and certain details or descriptions (e.g. the relative configurations or electrical connections, and the formations and materials) of the same elements may not be repeated herein.

Figure 4A:
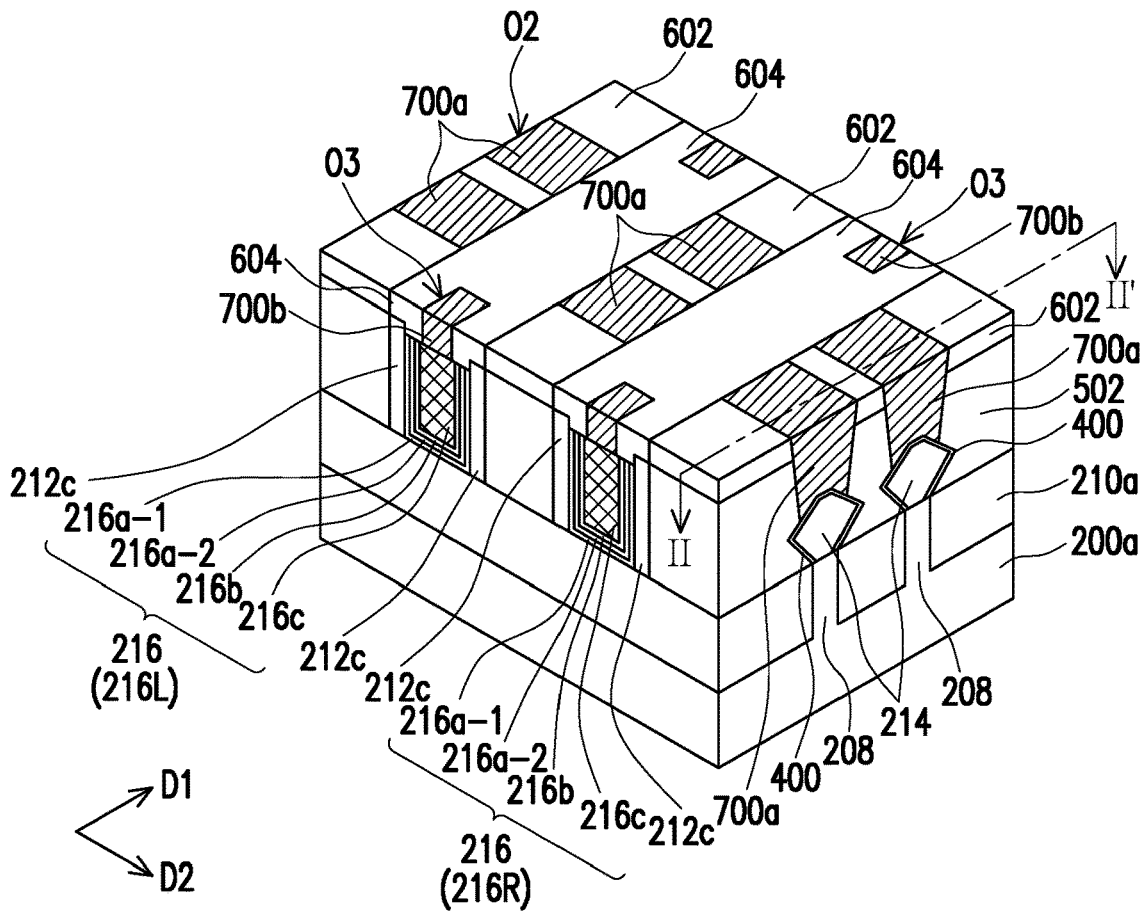
FIG. 4A to FIG. 4G are perspective views illustrating a manufacturing method of a FinFET in accordance with some embodiments of the disclosure.
Figure 5A:
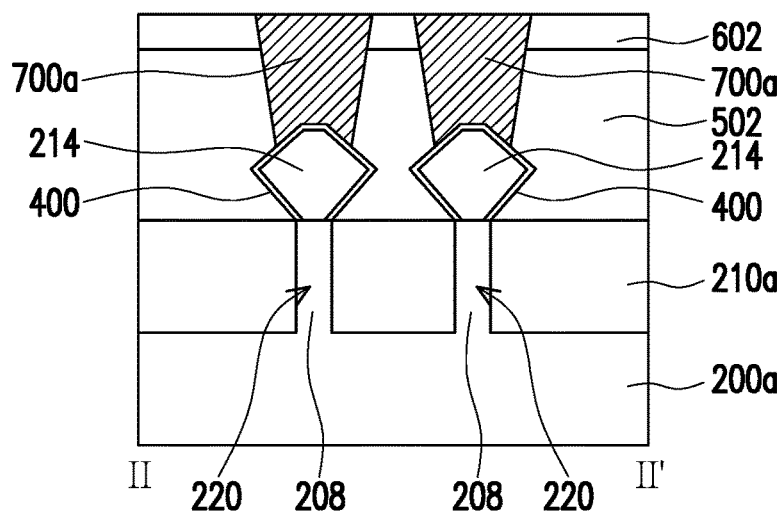
FIG. 5A to FIG. 5G are cross-sectional views of the FinFET depicted in FIG. 4A to FIG. 4G.
Figure 6:
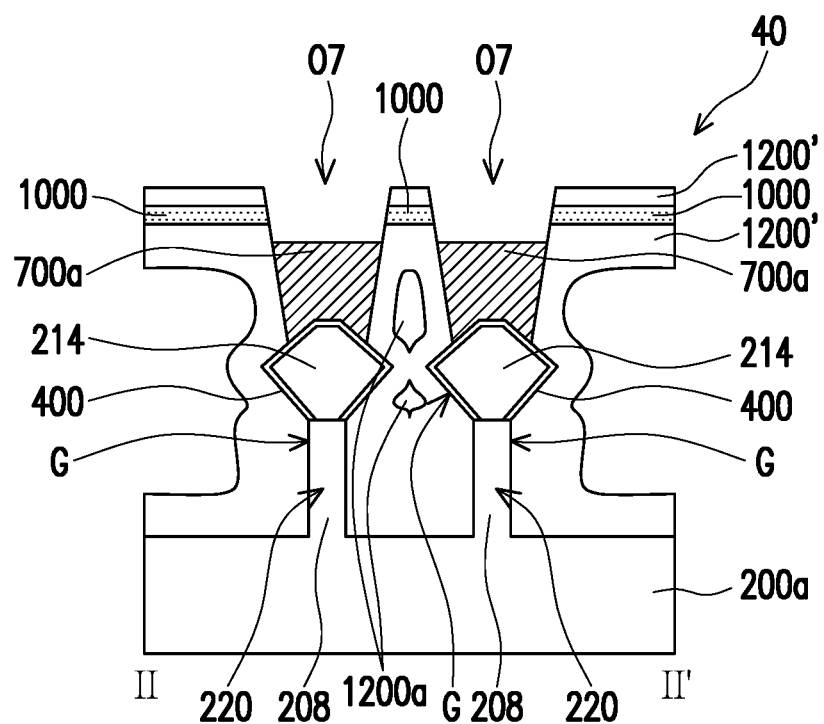
FIG. 6 is a cross-sectional view illustrating a FinFET in accordance with some embodiments of the disclosure.

Referring to FIG. 4A and FIG. 5A, in some embodiments, a plurality of openings O2, a plurality of openings O3, conductive vias 700a, and conductive vias 700b are formed, following the process as described in FIG. 1M and FIG. 2M. The process of FIG. 4A and FIG. 5A is similar to or the same as the process as described in FIG. 1N and FIG. 2N, where the process as described in FIG. 1N and FIG. 2N is provided with great details above, and thus the process of FIG. 4A and FIG. 5A is not repeated herein. The difference is that, the heights of the conductive vias 700a and the 700b depicted in FIG. 4A and FIG. 5A is greater than the heights of the conductive vias 700a and the 700b depicted in FIG. 1N and FIG. 2N. For example, the conductive vias 700a are respectively formed in the openings O2 formed in the interlayer dielectric layer 602 and the interlayer dielectric layer 502, and the conductive vias 700b are respectively formed in the openings O3 formed in the hard mask layer 604, where the top surfaces of the conductive vias 700a are above the top surface of the interlayer dielectric layer 502 and substantially levelled with the top surface of the interlayer dielectric layer 602, and the top surfaces of the conductive vias 700b are substantially levelled with the top surface of the hard mask layer 604, as shown in FIG. 4A and FIG. 5A.

Figure 4B:
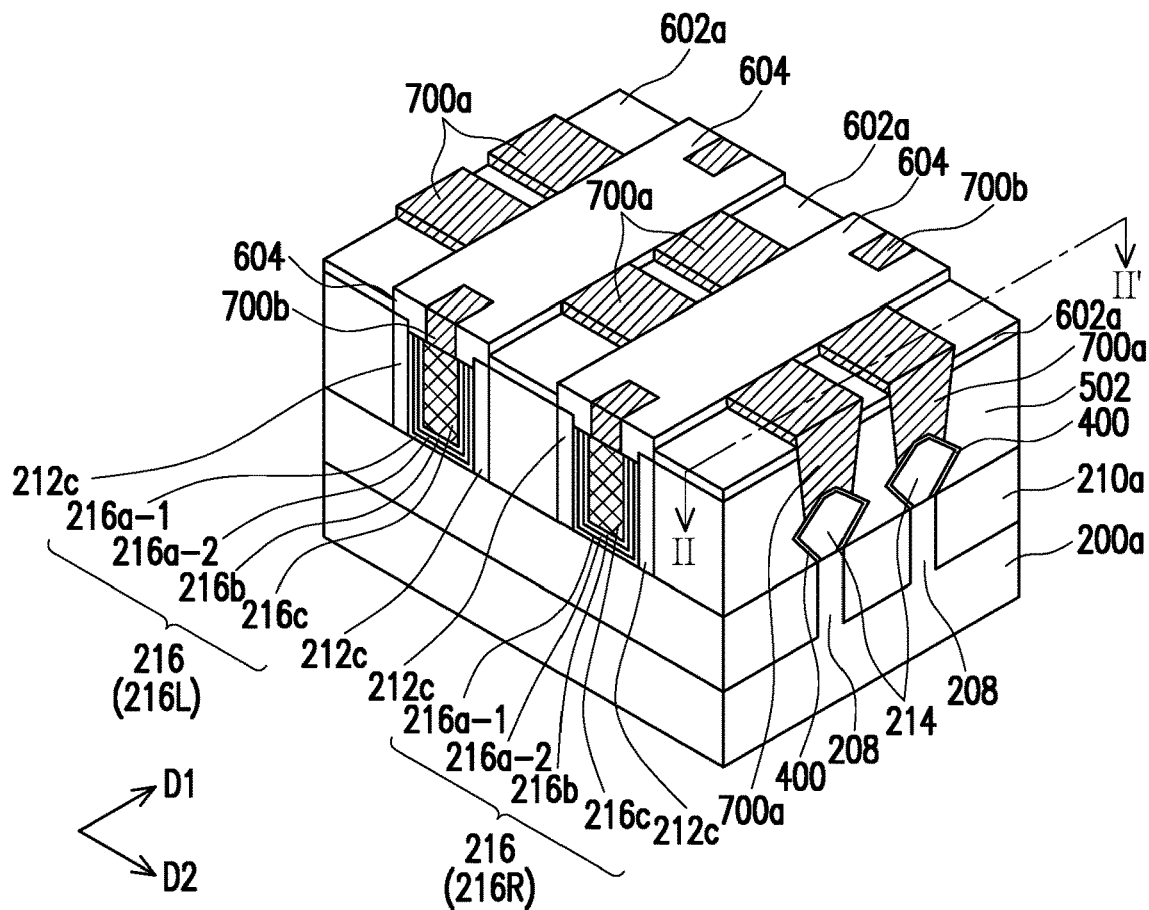
Figure 5B:
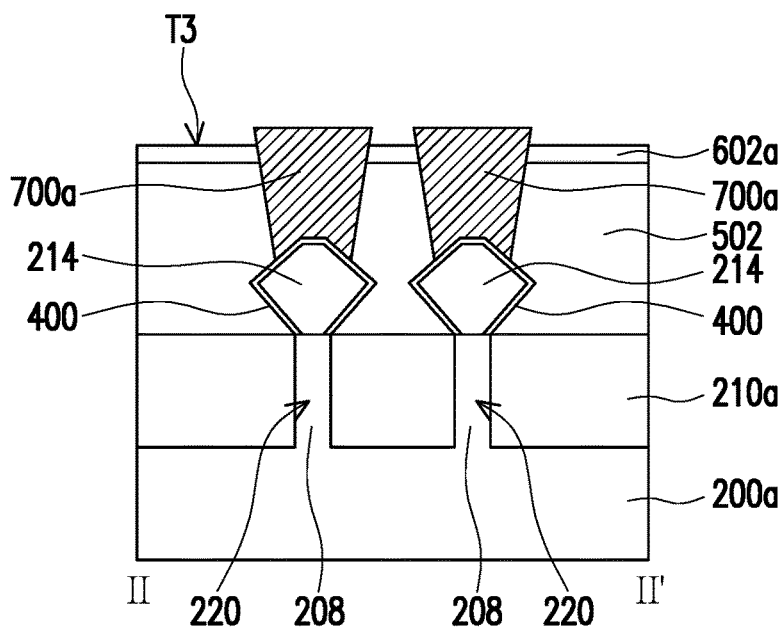

Referring to FIG. 4B and FIG. 5B, in some embodiments, a portion of the interlayer dielectric layer 602 is removed to form a thinned interlayer dielectric layer 602a. In some embodiments, a top surface T3 of the thinned interlayer dielectric layer 602a is below the top surfaces of the conductive vias 700a, as shown in FIG. 4B and FIG. 5B. In other words, the top surfaces of the conductive vias 700a are protruded from the top surface T3 of the thinned interlayer dielectric layer 602a, for example. In some embodiments, the interlayer dielectric layer 602 may be partially removed by an etching process, where the etching process may include a wet etching process, a dry etching process, or a combination thereof. The disclosure is not limited thereto.

Figure 4C:
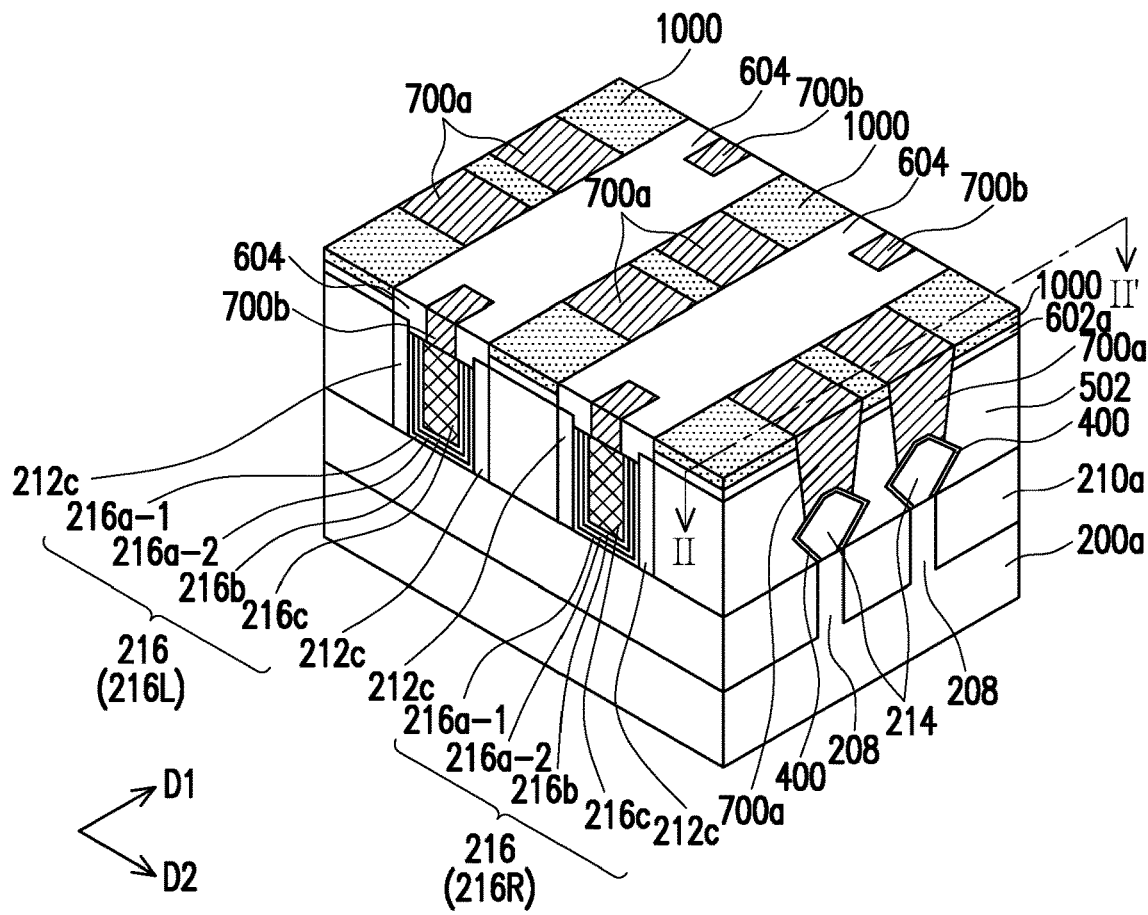
Figure 5C:
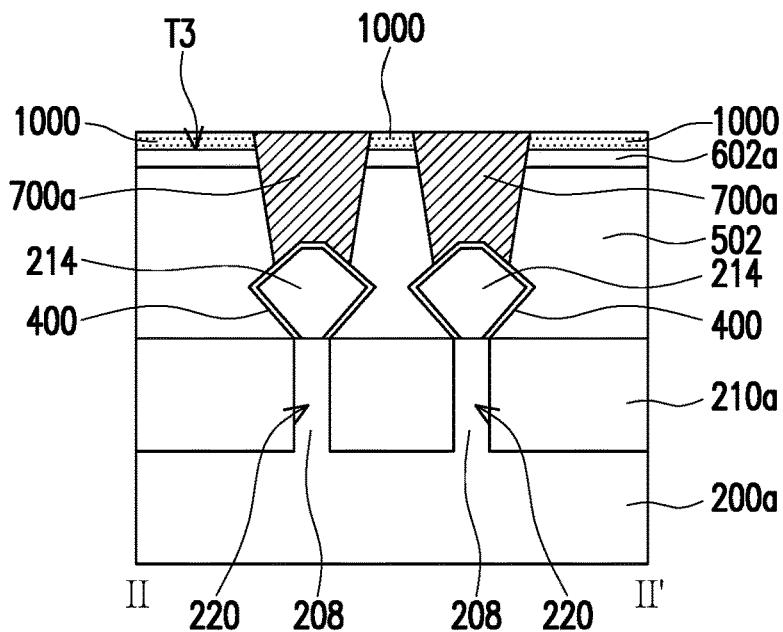

Referring to FIG. 4C and FIG. 5C, in some embodiments, a patterned hard mask layer 1000 is formed over the semiconductor substrate 200a. In some embodiments, the patterned hard mask layer 1000 is formed in the locations where the removed portion of the interlayer dielectric layer 602 are originally located. For example, the patterned hard mask layer 1000 may be formed by depositing a hard mask material over the semiconductor substrate 200a in a form of a blanket layer covering the structure depicted in FIG. 4B and FIG. 5B, and then thinning the blanket layer of the hard mask material until the conductive vias 700a and the conductive 700b are exposed to form the patterned hard mask layer 1000. In some embodiments, the hard mask k material includes SiCN, silicon oxy-carbonitride (SiOCN), or high-K dielectrics. High-K dielectrics includes metal oxides. It should be noted that the high-K dielectric materials are generally dielectric materials having a dielectric constant greater than 4. Examples of metal oxides used for high-K dielectrics include oxides of Li, Be, Mg. Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. The hard mask material may be formed using a suitable process such as ALD, CVD, PVD, thermal oxidation, UV-ozone oxidation, or combinations thereof. The thinning process may include a planarizing process or an etching process, the disclosure is not limited thereto.

Figure 4D:
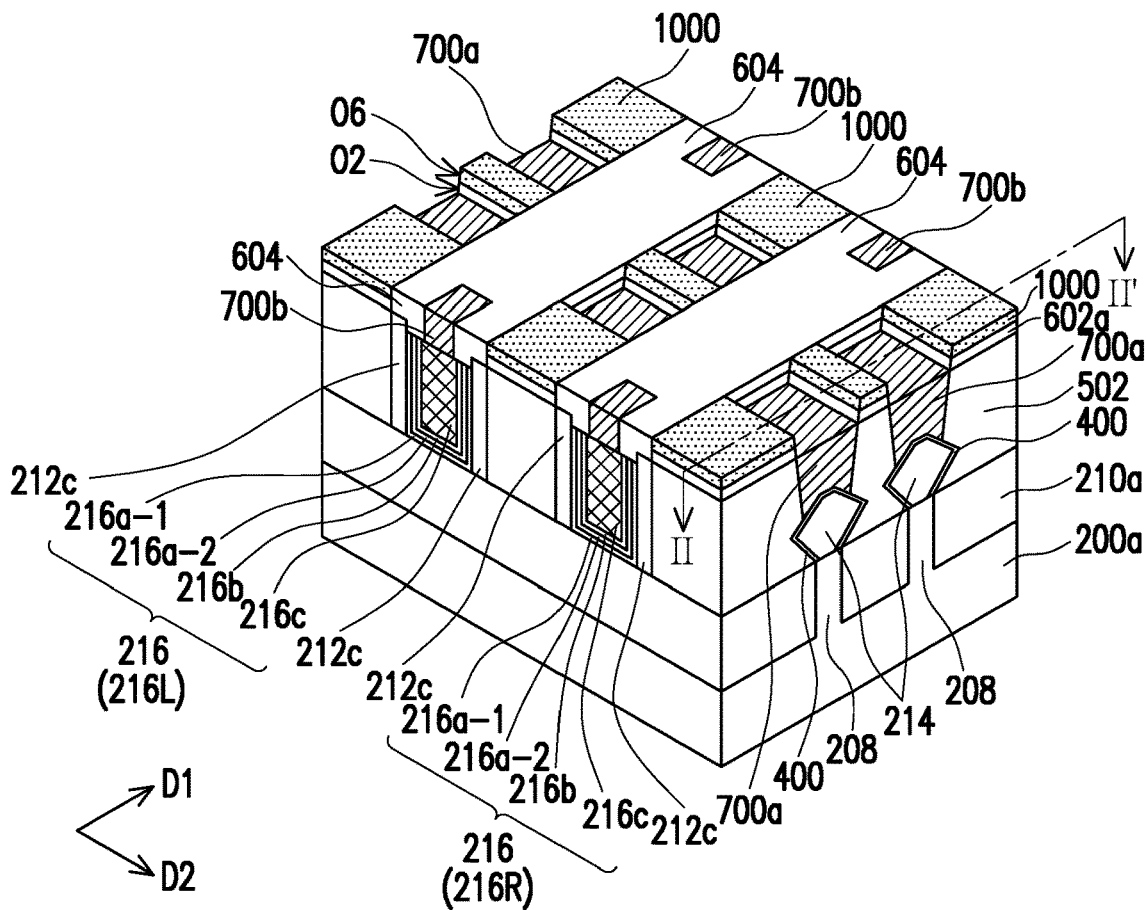
Figure 5D:
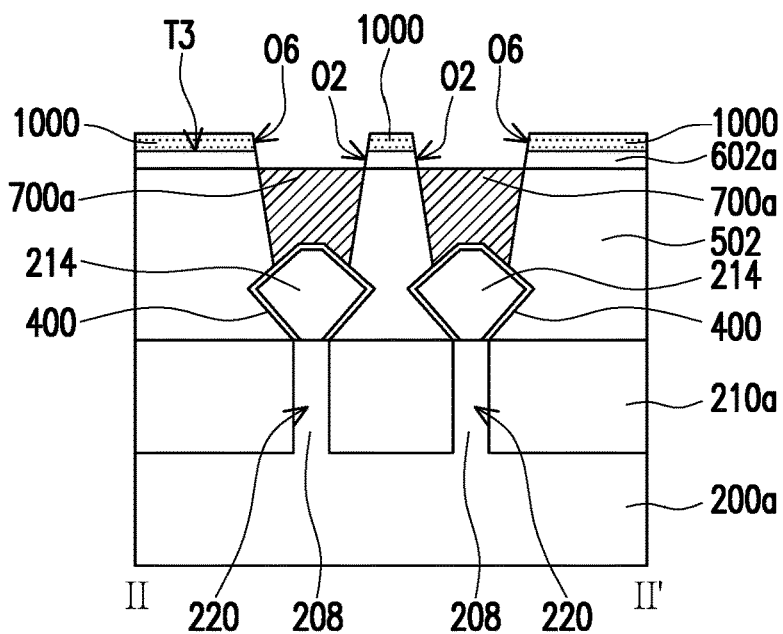

Referring to FIG. 4D and FIG. 5D, in some embodiments, portions of the conductive vias 700a are removed to form a plurality of openings O6 exposing sidewalls of the thinned interlayer dielectric layer 602a. For example, the thinned interlayer dielectric layer 602a are accessibly revealed by the openings O6. The removal method of the conductive vias 700a may include an etching process, where the etching process may be a wet etching, a dry etching, and a combination thereof.

Figure 4E:
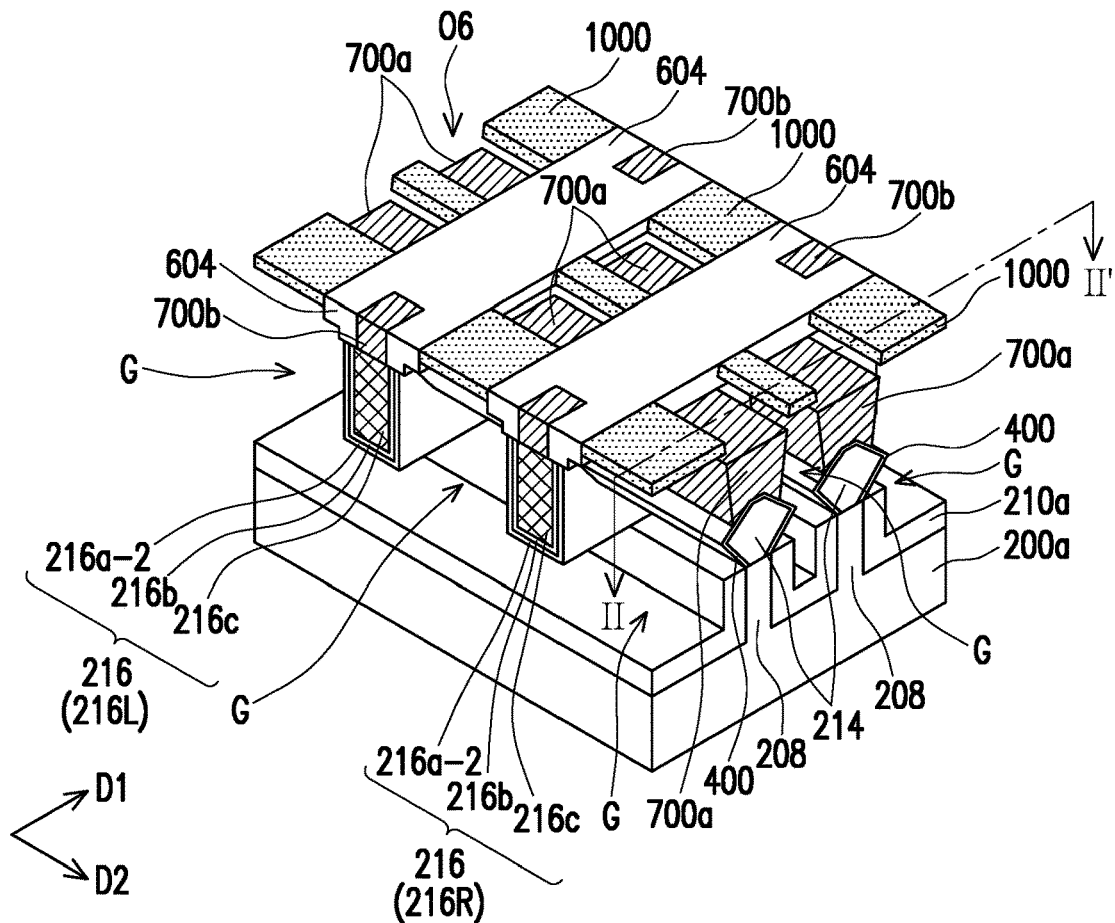
Figure 5E:
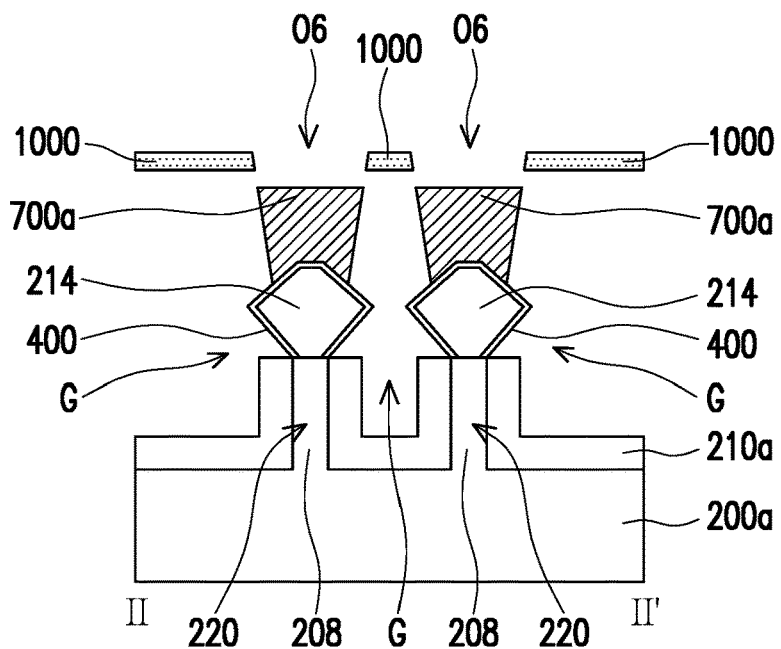

Referring to FIG. 4E and FIG. 5E, in some embodiments, after the thinned interlayer dielectric layer 602a are accessibly revealed, an etching process is performed to form a plurality of air gaps G. In some embodiments, some of the air gaps G are formed between two adjacent gate stacks 216 (e.g. the gate stack 216L and the gate stack 216R), and some of the air gaps G are formed between two adjacent strained materials 214 located on a side of one of the gate stacks 216 or sandwiched between two adjacent gate stacks 216, between two adjacent semiconductor fins 208, and between two adjacent conductive vias 700a, as shown in FIG. 4E and FIG. 5E. For example, the air gaps G are spatially communicated to one another, which constitute a hollow channel inside the semiconductor device. Due to the air gaps G (e.g., the hollow channel formed by connecting the air gaps G), an overall parasitic capacitance of the semiconductor device is greatly suppressed, thereby enhancing the electric performance of the semiconductor device.

In some embodiments, the air gaps G may be formed by removing the thinned interlayer dielectric layer 602a, the interlayer dielectric layer 502, the oxide dielectric layer 216a-1, the spacers 212c, and portions of the insulators 210a to by etching. In some embodiments, the etching process may include one or more than one etching processes. For example, the etching process may include a wet etching process with hydrofluoric acid (HF), Buffered HF (bHF), Hydrogen Peroxide ($H_2O_2$), Tetramethylammonium hydroxide (TMAH), or other suitable etchants, or the like. For example, the thinned interlayer dielectric layer 602 is removed by an etching step to form one or more than one through holes (not shown) exposing the underlying interlayer dielectric layer 502, and finally, the entire thinned interlayer dielectric layer 602, the interlayer dielectric layer 502, the oxide dielectric layer 216a-1, the spacers 212c, and the portions of the insulators 210a are removed in the same etching step or in different etching steps to form the air gaps G. In other words, the through holes are also spatially communicated with the air gaps G. During the above etching processes, the metal elements (e.g. the gates 216b, the conductive vias 700a and 700b, and the conductive structures 800a and 800b) and the hard-mask-like elements (e.g. the high-k layer 216a-2, the hard mark layer 604, and the patterned hard mask layer 1000) are not removed with respect to the removals of the thinned interlayer dielectric layer 606, the portion of the interlayer dielectric layer 602, the oxide dielectric layer 216a-1, the spacers 212c, and the portions of the insulators 210a due to the specific etching selectivity chosen based on the material differences.

However, the disclosure is not limited thereto. In an alternative embodiment, the etching process may include a dry etching process or a combination of dry etching and wet etching processes.

Figure 4F:
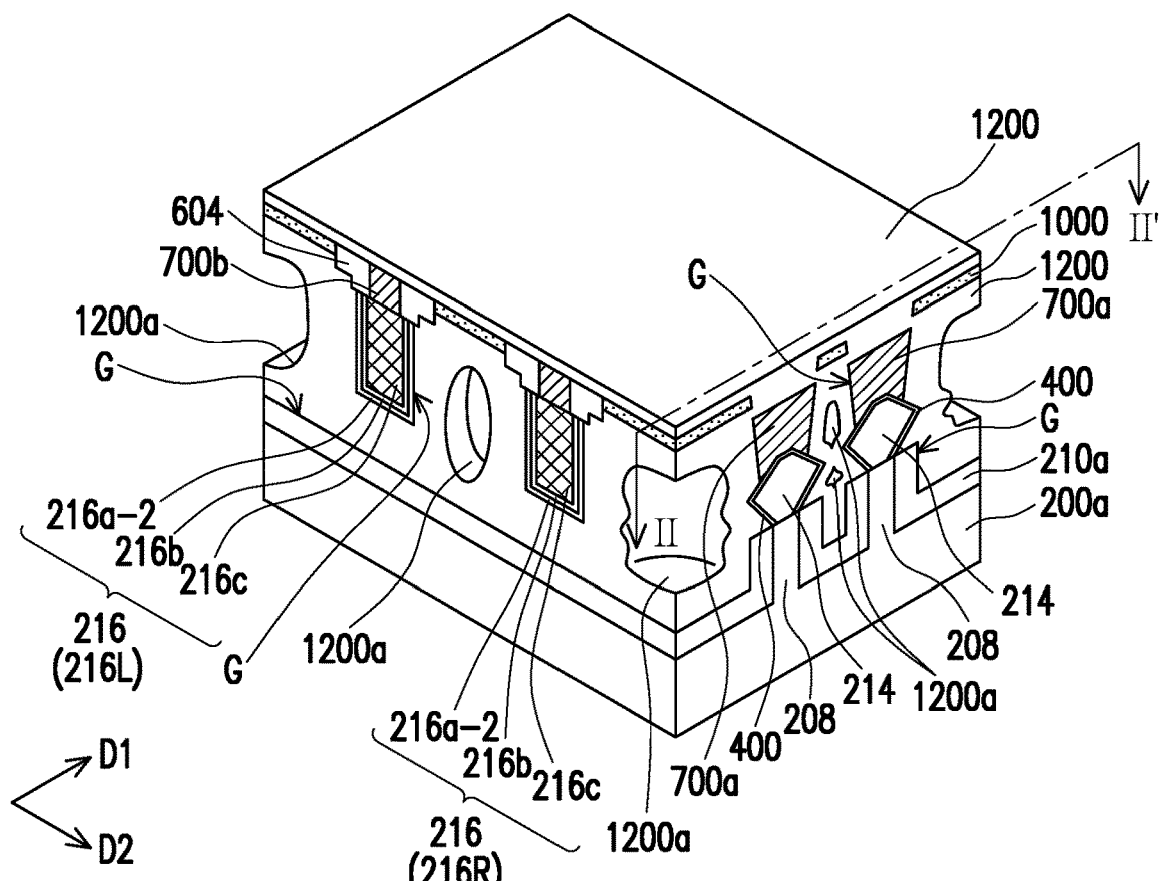
Figure 5F:
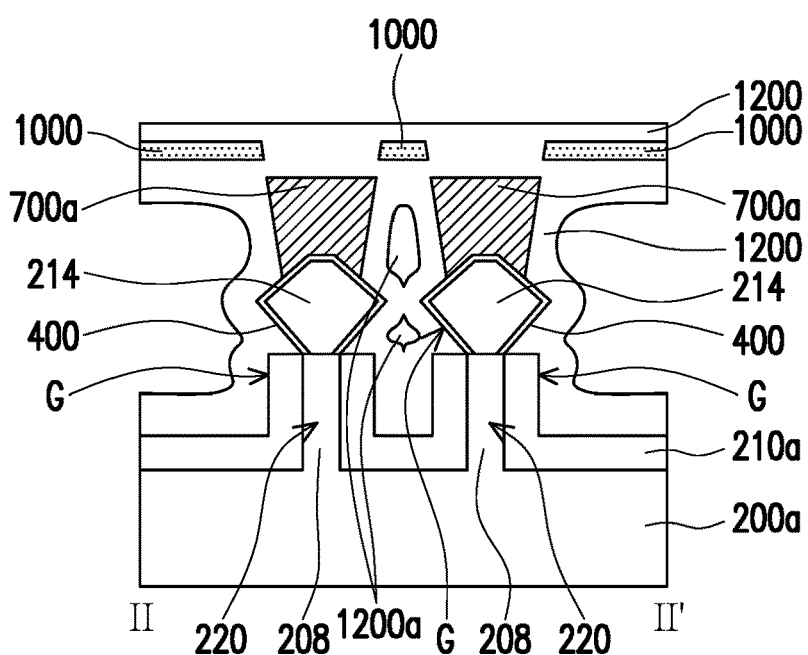

Referring to FIG. 4F and FIG. 5F, in some embodiments, a cap layer 1200 is formed over the structure depicted in FIG. 4E and FIG. 5E. In some embodiments, the patterned hard mask layer 1000, the conductive vias 700a, the conductive vias 700b, and the hard mask layer 604 are completely covered by and embedded in the cap layer 1200. In some embodiments, the openings O6 and the through holes are sealed. For example, in FIG. 4F and FIG. 5F, a portion of the cap layer 1200 is extended into the air gaps G during the formation thereof, where a plurality of gaps 1200a are formed inside the portion of the cap layer 1200 extended into the air gaps G. The deposition process and the material of the cap layer 1200 are the same or similar to the formation and material of the cap layer 1100 described in the process of FIG. 3, and thus are not repeated herein. As shown in FIG. 4F and FIG. 5F, the cap layer 1200 fills into the air gaps G and covers sidewalls of the air gaps G, where the gaps 1100a are present in the semiconductor device for suppressing the parasitic capacitance of the semiconductor device, thereby enhancing the electric performance of the semiconductor device. Owing to the cap layer 1200, the semiconductor device is capable of resisting moisture and oxygen from the external environment, thereby ensuring the reliability of the semiconductor device. The gaps 1200a is, for example, air gaps.

Figure 4G:
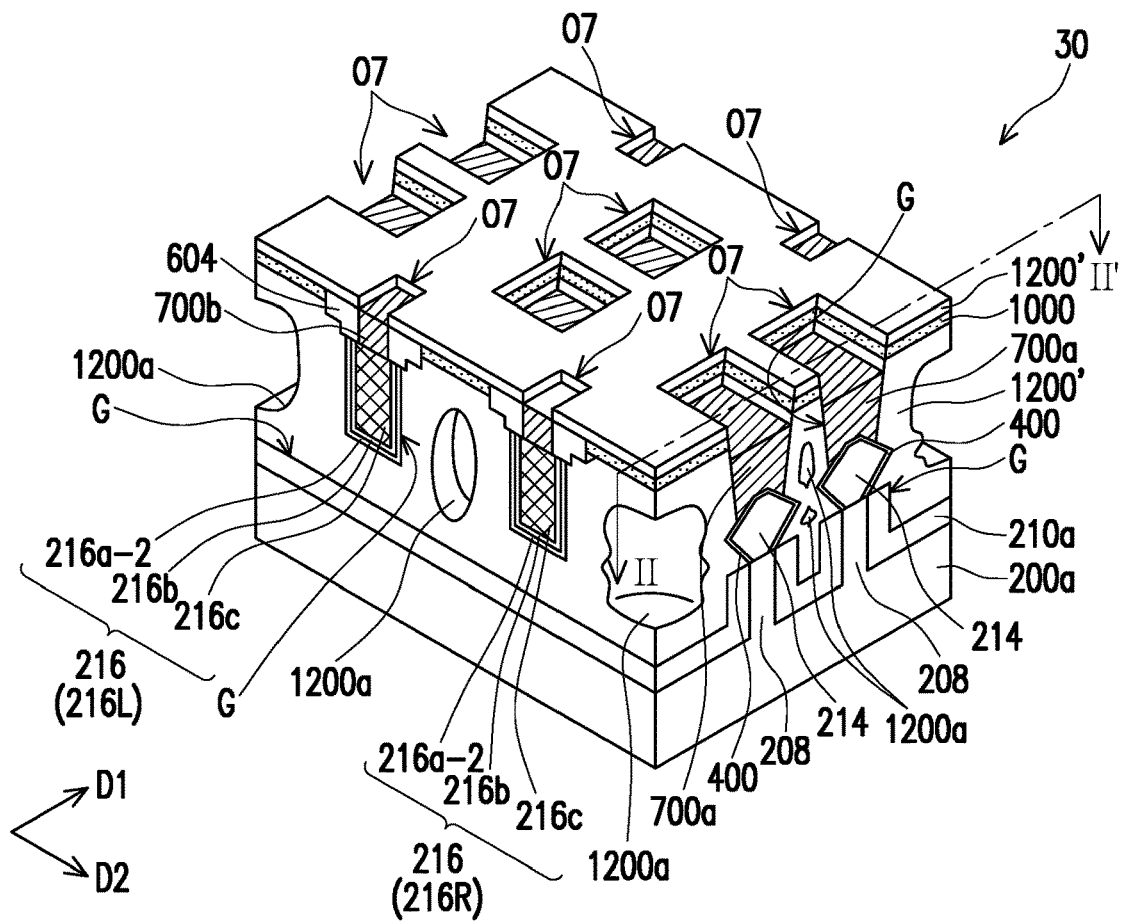
Figure 5G:
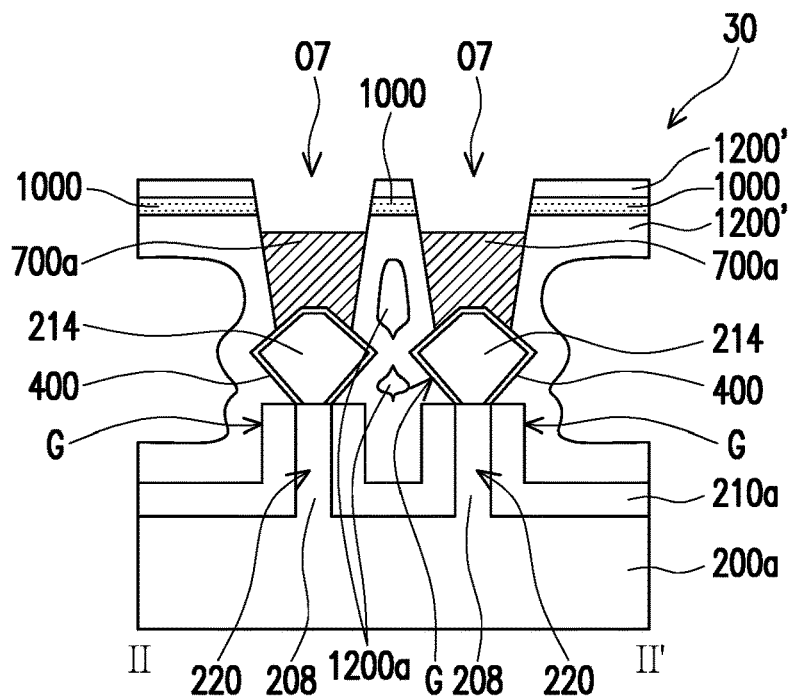

Referring to FIG. 4G and FIG. 5G, in some embodiments, an etching process is performed to form a patterned cap layer 1200'. For example, the cap layer 1200 is patterned to form the patterned cap layer 1200' having openings O7 exposing the top surfaces of the conductive vias 700a and the top surfaces of the conductive vias 700b. In other words, locations of the openings O7 correspond to locations of the conductive vias 700a and the conductive vias 700b, for example; and thus, the conductive vias 700a and the conductive vias 700b are exposed by the patterned cap layer 1200' for electrically connecting to a later-formed element (e.g. a conductive element providing a routing function, or the like).

In some embodiments, the cap layer 1200 may be patterned by an etching process including a wet etching, a dry etching, or a combination thereof. After the patterning process, a cleaning step may be optionally performed, for example to clean and remove the residue generated from the patterning process. However, the disclosure is not limited thereto, and the patterning process may be performed through any other suitable method. Up to here, the semiconductor device (e.g. a FinFET 30) is manufactured.

However, the disclosure is not limited thereto. In some embodiments, the insulators 210a remained in the FinFET 30 shown in FIG. 4G and FIG. 5G may be completed removed (see a FinFET 40 depicted in FIG. 6), and sidewalls of the semiconductor fins 208 may be revealed by the air gaps G and wrapped by the cap layer 1200'.

In accordance with some embodiments of the disclosure, a method of manufacturing a FinFET includes at last the following steps, patterning a semiconductor substrate to form trenches in the semiconductor substrate and semiconductor fins located between two adjacent trenches of the trenches; forming gate stacks over portions of the semiconductor fins; forming strained material portions over the semiconductor fins revealed by the gate stacks; forming first metal contacts over the gate stacks, the first metal contacts electrically connecting the strained material portions; and forming air gaps in the FinFET at positions between two adjacent gate stacks of the gate stacks.

In accordance with some embodiments of the disclosure, a method of manufacturing a FinFET includes at last the following steps, providing a semiconductor substrate; patterning the semiconductor substrate to form trenches in the semiconductor substrate and semiconductor fins located between two adjacent trenches of the trenches; forming insulators in the trenches, respectively; forming dummy gate stacks over portions of the semiconductor fins and portions of the insulators; forming strained material portions over the semiconductor fins revealed by the dummy gate stacks; replacing the dummy gate stacks with gate stacks; forming first metal contacts over the gate stacks, the first metal contacts electrically connecting the strained material portions; forming second metal contacts over the gate stacks, the second metal contacts electrically connecting the gate stacks; and forming air gaps in the FinFET at positions between two adjacent gate stacks of the gate stacks.

In accordance with some embodiments of the disclosure, a FinFET includes a semiconductor substrate, gate stacks, strained material portions, first metal contacts, and second metal contacts. The semiconductor substrate includes trenches and semiconductor fins located between the trenches. The gate stacks are located over the semiconductor substrate, wherein the gate stacks are located over portions of the semiconductor fins. The strained material portions cover portions of the semiconductor fins revealed by the gate stacks. The first metal contacts are located over and electrically connected to the strained material portions. The second metal contacts are located over and electrically connected to the gate stacks. The air gaps are located in the FinFET at positions between any two adjacent gate stacks of the gate stacks along a lengthwise direction of the semiconductor fins.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fin field effect transistor (FinFET), comprising:
a substrate;
a plurality of fins, standing on the substrate and extending along a first direction, the plurality of fins being separated by insulators;
a plurality of gates, disposed over the plurality of fins and extending along a second direction, the first direction being different from the second direction, and the plurality of gates covering portions of the plurality of fins; and
a plurality of source/drain elements, covering portions of the plurality of fins exposed by the plurality of gates, wherein bottoms of the plurality of source/drain elements are above bottoms of the insulators,
wherein an air gap is disposed on the insulators with a bottom of the air gap being lower than top surfaces of the insulators.

2. The FinFET of claim 1, wherein the air gap is further disposed at positions between two adjacent gates of the plurality of gates along the first direction and positions between two adjacent fins of the plurality of fins along the second direction.

3. The FinFET of claim 1, further comprising:
a cap layer, over the substrate and extending onto the plurality of fins, the plurality of source/drain elements and the plurality of gates, the cap layer further extending into the air gap.

4. The FinFET of claim 1,
wherein the insulators are trench isolation structures, and the insulators are disposed inside trenches of the trench isolation structures, wherein the air gap is overlapped with the insulators in a stacking direction of the plurality of fins and the substrate.

5. The FinFET of claim 4, further comprising:
a cap layer, over the substrate and extending onto the insulators, the plurality of source/drain elements and the plurality of gates.

6. The FinFET of claim 1, wherein the air gap is further disposed in the FinFET at positions between the plurality of gates and the substrate in a stacking direction of the plurality of fins and the substrate.

7. The FinFET of claim 1, further comprising:
a plurality of gate contacts, disposed on and electrically coupled to the plurality of gates; and
a plurality of source/drain contacts, disposed on and electrically coupled to the plurality of source/drain elements,
wherein the air gap is further disposed in the FinFET at positions between two adjacent source/drain contacts of the plurality of source/drain contacts and positions between two adjacent source/drain elements of the plurality of source/drain elements.

8. A fin field effect transistor (FinFET), comprising:
a plurality of fins, separated from one another by a plurality of trenches;
a plurality of gates, disposed over the plurality of fins, the plurality of gates covering first portions of the plurality of fins and portions of the plurality of trenches, wherein an air gap is laterally disposed in the FinFET at positions between two adjacent gates of the plurality of gates;
a plurality of source/drain elements, covering second portions of the plurality of fins next to the first portions and exposed by the plurality of gates; and
a cap film, disposed over the plurality of gates and further extending into the air gap and the plurality of trenches.

9. The FinFET of claim 8, further comprising:
a plurality of insulators, lining the plurality of trenches, wherein an outer surface of each of the plurality of insulators is exposed to the air gap.

10. The FinFET of claim 9, wherein the plurality of fins are separated from the cap layer by the plurality of insulators.

11. The FinFET of claim 8, wherein the air gap is further disposed in the FinFET at positions inside the plurality of trenches.

12. The FinFET of claim 8, wherein the air gap is further disposed in the FinFET at positions between two adjacent fins of the plurality of fins.

13. The FinFET of claim 8, wherein the air gap is further disposed in the FinFET at positions between two adjacent source/drain elements of the plurality of source/drain elements.

14. The FinFET of claim 8, further comprising:
a plurality of gate contacts, disposed on and electrically coupled to the plurality of gates; and
a plurality of source/drain contacts, disposed on and electrically coupled to the plurality of source/drain elements,
wherein the air gap is further disposed in the FinFET at positions between two adjacent source/drain contacts of the plurality of source/drain contacts and positions between two adjacent source/drain elements of the plurality of source/drain elements.

15. A fin field effect transistor (FinFET), comprising:
a plurality of gates, disposed over a plurality of semiconductor fins;
a plurality of source/drain elements, covering portions of the plurality of semiconductor fins exposed by the plurality of gates; and
a cap layer, wherein an air gap is disposed in the FinFET at positions laterally between two adjacent semiconductor fins of the plurality of semiconductor fins, and the cap layer extends onto the plurality of semiconductor fins, the plurality of source/drain elements and the plurality of gates.

16. The FinFET of claim 15, wherein the plurality of semiconductor fins are separated from one another by a plurality of trenches, and the air gap is further disposed in the FinFET at positions inside the plurality of trenches.

17. The FinFET of claim 16, further comprising:
a plurality of insulators, disposed inside the plurality of trenches and covering sidewalls of the plurality of semiconductor fins, wherein the air gap is overlapped with the plurality of insulators in a lateral direction substantially perpendicular to a stacking direction of the plurality of semiconductor fins and the plurality of source/drain elements.

18. The FinFET of claim 15, wherein the air gap is further disposed in the FinFET at positions between the plurality of gates and the plurality of insulators in a stacking direction of the plurality of semiconductor fins and the plurality of source/drain elements.

19. The FinFET of claim 15, further comprising:
a plurality of gate contacts, disposed on and electrically coupled to the plurality of gates; and
a plurality of source/drain contacts, disposed on and electrically coupled to the plurality of source/drain elements,
wherein the air gap is further disposed in the FinFET at positions between two adjacent source/drain contacts of the plurality of source/drain contacts and positions between two adjacent source/drain elements of the plurality of source/drain elements.

20. The FinFET of claim 15, wherein the air gap is further disposed in the FinFET at positions underneath the plurality of gates in a stacking direction of the plurality of semiconductor fins and the plurality of source/drain elements.

* * * * *